United States Patent
Garrity et al.

(10) Patent No.: US 10,651,811 B2
(45) Date of Patent: May 12, 2020

(54) MISMATCH AND REFERENCE COMMON-MODE OFFSET INSENSITIVE SINGLE-ENDED SWITCHED CAPACITOR GAIN STAGE WITH REDUCED CAPACITOR MISMATCH SENSITIVITY

(71) Applicant: NXP USA, Inc., Austin, TX (US)

(72) Inventors: Douglas A. Garrity, Gilbert, AZ (US); Mariam Hoseini, San Mateo, CA (US); Mohammad N. Kabir, Tempe, AZ (US); Brandt Braswell, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/983,292

(22) Filed: May 18, 2018

(65) Prior Publication Data
US 2019/0356290 A1 Nov. 21, 2019

(51) Int. Cl.
*H03F 3/45* (2006.01)
*H03G 1/00* (2006.01)
*H03G 3/30* (2006.01)

(52) U.S. Cl.
CPC ....... *H03G 1/0094* (2013.01); *H03F 3/45475* (2013.01); *H03G 3/3089* (2013.01); *H03F 2200/129* (2013.01); *H03F 2203/45514* (2013.01); *H03F 2203/45551* (2013.01); *H03G 2201/103* (2013.01); *H03G 2201/502* (2013.01)

(58) Field of Classification Search
USPC .................................................. 330/252–261
See application file for complete search history.

(56) References Cited

U.S. PATENT DOCUMENTS

| | | |
|---|---|---|
| 6,169,427 B1 | 1/2001 | Brandt |
| 6,362,770 B1 | 3/2002 | Miller et al. |
| 6,396,429 B2 * | 5/2002 | Singer ................. H03M 1/1245 341/155 |
| 6,909,393 B2 | 6/2005 | Atriss et al. |
| 6,967,611 B2 | 11/2005 | Atriss et al. |

(Continued)

OTHER PUBLICATIONS

Hafiz et al "Immediate Calibration of Operational Amplifier Gain Error in Pipelined ADCs using extended Correlated Double Sampling". IEEE Journal of Solid-State Circuits, vol. 48, No. 3, Mar. 2013. pp. 749-759 (11 pages).

(Continued)

*Primary Examiner* — Hieu P Nguyen

(57) ABSTRACT

A switched-capacitor gain stage circuit and method include an amplifier connected to an input sampling circuit with sampling switched capacitors for coupling an input voltage and a first or second reference voltage to one or more central nodes during a sampling phase and for coupling the one or more central nodes to an amplifier input during a gain phase, wherein a reference loading circuit uses a plurality of sampling switched capacitors connected in a switching configuration to selectively couple a first reference voltage and/or a second reference voltage to the central node by pre-charging the plurality of sampling switched capacitors with the first and second reference voltages during the sampling phase, and by coupling each of the first and second reference voltages to at least one of the plurality of sampling switched capacitors when connected to the central node during the gain phase.

22 Claims, 12 Drawing Sheets

(56) References Cited

U.S. PATENT DOCUMENTS

| | | | |
|---|---|---|---|
| 7,030,804 B2* | 4/2006 | Yoshioka | G11C 27/024 341/155 |
| 7,589,658 B2 | 9/2009 | Ren et al. | |
| 7,595,666 B2 | 9/2009 | Braswell et al. | |
| 7,843,232 B2 | 11/2010 | Farhat et al. | |
| 8,400,339 B2 | 3/2013 | Garrity et al. | |
| 8,487,803 B1 | 7/2013 | Garrity | |
| 2007/0126615 A1 | 6/2007 | Kim et al. | |
| 2014/0253355 A1 | 9/2014 | Quiquempoix | |

OTHER PUBLICATIONS

D. Garrity et al., "A 10 bit, 2Ms/s, 15 mW BiCMOS cyclic RSD A/D converter," Proceedings of the 1996 Bipolar/BiCMOS Circuits and Technology Meeting, Minneapolis, MN, 1996, pp. 192-195.

J. Kuppambatti et al., Current Reference Pre-Charging Techniques for Low-Power Zero-Crossing Pipeline-SAR ADCs, IEEE Journal of Solid-State Circuits, vol. 49, No. 3, Mar. 2014, pp. 683-694.

I. E. Opris et al., "A single-ended 12-bit 20 Msample/s self-calibrating pipeline A/D converter," IEEE Journal of Solid-State Circuits, vol. 33, No. 12, pp. 1898-1903, Dec. 1998.

J. H. Park et al., "A High-Speed Low-Noise CMOS Image Sensor With 13-b Column-Parallel Single-Ended Cyclic ADCs," IEEE Transactions on Electron Devices, vol. 56, No. 11, pp. 2414-2422, Nov. 2009.

W. Song et al.,"A 10-b 20-Msample/s low-power CMOS ADC," IEEE Journal of Solid-State Circuits, vol. 30, No. 5, pp. 514-521, May 1995.

A. Norouzpour-Shirazi et al., "A Novel Low Power 1 GS/s S&H Architecture With Improved Analog Bandwidth," IEEE Transactions on Circuits and Systems—II: Express Briefs, vol. 55, No. 10, Oct. 2008, pp. 971-975.

K. Ohhata et al., "Design of a 770-MHz, 70-mW, 8-bit Subranging ADC Using Reference Voltage Precharging Architecture," IEEE Journal of Solid-State Circuits, vol. 44, No. 11, pp. 2881-2890, Nov. 2009.

U.S. Appl. No. 15/946,770, filed Apr. 6, 2018, 42 pages.

Notice of Allowance, U.S. Appl. No. 15/946,770, filed Jul. 20, 2018, 15 pages.

* cited by examiner

MISMATCH AND REFERENCE COMMON-MODE OFFSET INSENSITIVE SINGLE-ENDED SWITCHED CAPACITOR GAIN STAGE WITH REDUCED CAPACITOR MISMATCH SENSITIVITY

BACKGROUND OF THE INVENTION

Field of the Invention

The present invention is directed in general to field of analog-to-digital converters. In one aspect, the present invention relates to a method, apparatus and system for single-ended switched capacitor integrated circuit gain stages.

Description of the Related Art

A variety of mixed signal processing circuits include gain stage circuits configured to amplify an analog input signal, such as by using a switched-capacitor gain circuit that may include a set of switched capacitors and an amplifier (e.g., an operational amplifier). The analog input signal is sampled and stored on the set of switched capacitors and is subsequently amplified by the amplifier for output from the gain circuit. Although conventional switched-capacitor gain circuits function well in a variety of applications, there are challenges with balancing the requirements for low power, high resolution, high speed, and small silicon area. For example, typical single-ended high resolution switched capacitor gain stages (such as those that are used to implement a redundant signed digit (RSD) cyclic or pipelined analog-to-digital converter (ADC)), suffer from extreme sensitivity to the common-mode reference offset, which adversely impacts the integral non-linearity (INL) and differential non-linearity (DNL) of the ADC and therefore also degrades the ADC's dynamic performance (e.g., total harmonic distortion (THD)). This problem arises from the RSD conversion algorithm which compares a sampled input voltage (Vin) to a high and low threshold voltage ($V_H$, $V_L$) to generate a residue voltage (Vx) as follows:

(1) If Vin<$V_L$: Vx=aVin+Vref (where 'a' represents the gain of the stage)
(2) If $V_L$<Vin<$V_H$: Vx=aVin
(3) If Vin>$V_H$: Vx=aVin−Vref.

In a differential input switched capacitor structure, the residue voltage generation during the intermediate voltage range (e.g., middle operation (2)) is performed by shorting the differential inputs together. However, for a single-ended switched capacitor structures, the intermediate residue voltage generation during the middle operation (2) functions properly only if the reference common mode voltage (Vcmr) is precisely set to the common mode of the reference voltages. Unfortunately, even very small Vcmr offsets (e.g., orders of magnitude smaller than the precise value of Vcmr) can result in redundant or missing codes with such single-ended switched capacitor structures, causing major degradations in in integral non-linearity (INL) and differential non-linearity (DNL) measures. While attempts have been made to address this problem by introducing circuitry to convert a single-ended input signal to a differential signal, the resulting circuits actually operate in a pseudo-differential fashion and introduce signal-to-noise and distortion degradation for high frequency input signals, and/or require additional high-performance circuitry to maintain linearity, thus increasing the overall cost and complexity of the gain stage while reducing performance. As seen from the foregoing, existing single-ended switched-capacitor gain stage circuits are extremely difficult at a practical level by virtue of the challenges with accurately converting analog input voltages into output residual voltages in the presence of Vcmr offsets that can degrade the linearity of such single-ended switched-capacitor gain stage circuits.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

Figure 1:
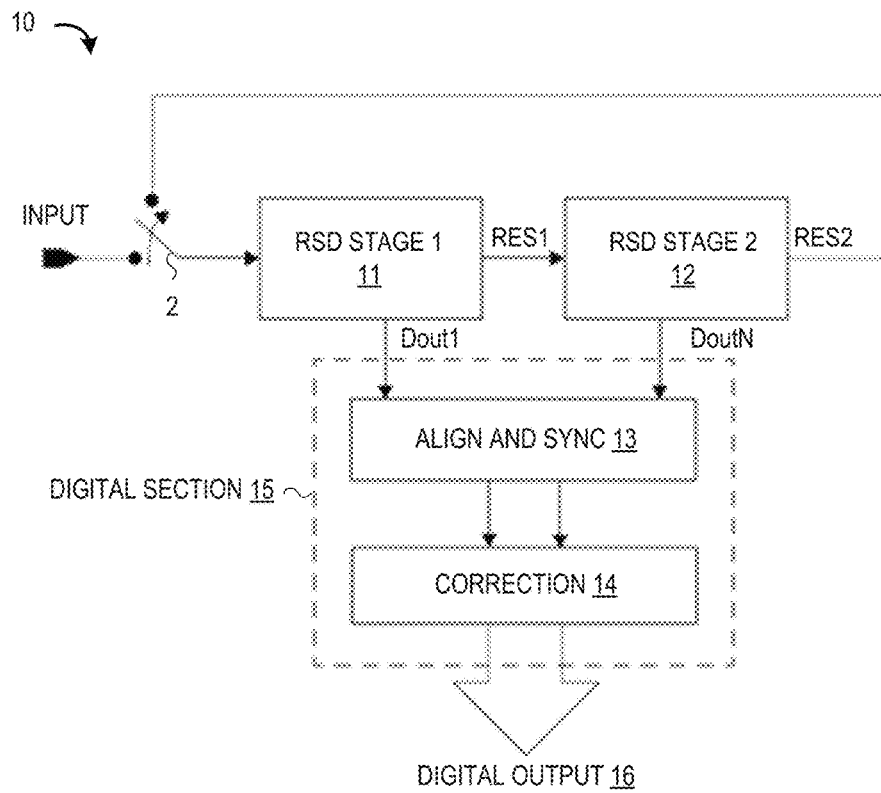
FIG. 1 is a simplified block diagram illustrating a cyclic redundant signed digit (RSD) analog-to-digital converter (ADC).

A high performance switched capacitor gain stage circuit, system, architecture, and methodology are described for a non-flip-around multiplying-DAC (MDAC) architecture with reference voltage sampling capacitor pre-charging to dynamically generate a reference common mode voltage (Vcmr) that is insensitive to capacitor mismatch and reference common-mode offset and that maintains the linearity of the circuit. In selected embodiments, the reference common mode voltage is generated by applying first and second reference voltages Vrefp, Vrefm to a pair of switched capacitors connected to an inverting input of an amplifier input of a single-ended switched capacitor stage during a defined intermediate input voltage range (e.g., $V_L<Vin<V_H$). In addition to maintaining linearity and reducing sensitivity to mismatch and offset, selected embodiments equalize the reference loading during residue generation by pre-charging the pair of switched capacitors to the same values (i.e., Vrefp or Vrefm) so that the charge drawn from the references during residue generation would always be the same, thereby limiting the distortion that might be caused by unequal reference settling. In selected embodiments, reference loading equalization is achieved by generating different residue voltages using two capacitors in a residue or gain phase (P2) which are pre-charged to different levels in a sampling phase (P1), depending upon the relative value of the input voltage Vin to a high voltage reference (VH) and a low voltage reference (VL). One way to equalize the loading on the references is to pre-charge the capacitors that are connected to reference voltages (Vrefp, Vrefm) to the same values (i.e., vrefp or vrefm) so that the charge drawn from the references during residue generation phase is kept constant, thereby limiting the distortion that might be caused by unequal reference settling and relaxing the extreme demands on the reference buffers. While described with reference to architectures targeted to overcome the common mode reference-offset problem associated with a single-ended switched capacitor stage, it will be appreciated that the reference common mode voltage generation techniques disclosed herein can be used in applications with both single-ended and differential inputs, and can be used with any switched capacitor architectures, such as RSD stages in a cyclic/pipelined ADC, with no limitation on the resolution of the stage.

While the present disclosure may be used in a wide variety of switched capacitor gain stage designs, for the sake of brevity, the present description refers to selected cyclic RSD-ADC embodiments without describing in detail conventional techniques related to switched capacitor-based gain stages, ADC architectures, voltage comparison circuits, digital logic circuits, and other functional aspect of such system and the individual system operating components thereof. Furthermore, the connecting lines shown in the various figures contained herein are intended to represent example functional relationships and/or physical couplings between the various elements. It should be noted that many alternative or additional functional relationships or physical connections may be present in a practical embodiment. In addition, for ease of discussion, the figures illustrate example single-ended implementations, but those skilled in the art can adapt the illustrated techniques for use in differential signaling applications using the provided guidelines without departing from the scope of the present disclosure.

Turning now to FIG. 1, there is shown a simplified block diagram illustration of a cyclic redundant signed digit (RSD) analog-to-digital converter (ADC) 10. As illustrated, ADC 10 includes a plurality of redundant signed digit (RSD) stages 11, 12 connected in a feedback loop to an input switch 2. Generally, the ADC 10 samples the analog signal (Vin) at the input switch 2 at a specified clock rate, and generates a digital output signal 16 corresponding to a voltage magnitude of each sampled input signal. Resolution of a cyclic ADC is a function of a number of ADC stages used. Each ADC stage provides at least one bit of resolution, starting with the most significant bit (MSB) for the first stage (11) (e.g., Dout1) and ending with least significant bits from the last stage (12) (e.g., DoutN).

Figure 2:
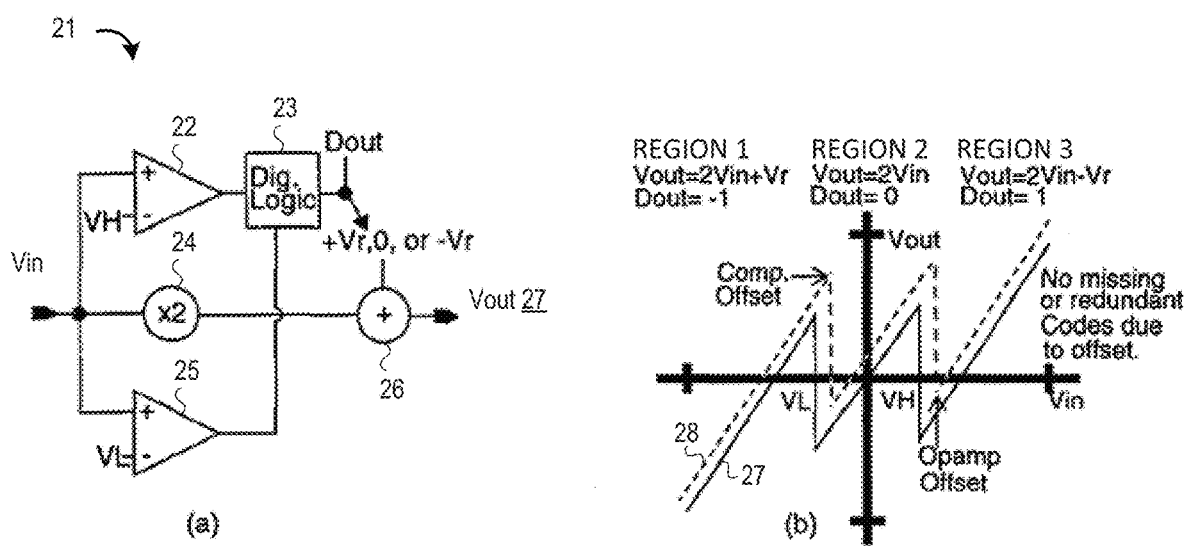
FIG. 2 depicts a simplified block diagram of an RSD stage (2a) and resulting output voltage waveform (2b) for a residual output voltage Vout generated by the RSD stage.

The comparator of an ADC stage compares the input voltage received by the ADC stage against a reference voltage and generates a corresponding logic level. One example of an ADC stage comparator is shown in FIG. 2(a) which depicts a simplified block diagram of an RSD stage 21 for generating a residual output voltage Vout from an input voltage Vin. The depicted RSD stage 21 includes two comparators 22, 25 comparing the input signal Vin against two reference voltage levels, VH and VL. If the input signal is less than VL, then the digital logic block 23 generates a digital output Dout for that stage (e.g., Dout1, Dout2, and the like) is set to the digital equivalent of –"1" (e.g., "00"). If the input signal is greater than VH, then the digital logic block 23 generates a digital output Dout for that stage is set to the digital equivalent of "1" (e.g., "10"). Otherwise, if the input signal is between VL and VH, then the digital logic block 23 sets the digital output Dout for that stage to the digital equivalent of "0" (e.g. "01"). This comparator configuration, along with the above-discussed switched-capacitor gain stage, is called a 1.5 bit RSD ADC stage.

At the depicted RSD stage 21, a residue voltage Vout 27 is generated to be passed on to the next stage. In the example above, if the input signal is less than VL (Region 1), then the input (Vin) is multiplied by a gain factor "a" (e.g., a=2) at the multiplier 24, and a reference voltage (Vref) is added at the summing circuit 26 to provide the residue, Vx=a Vin+Vref. If the input signal is greater than VH (Region 3), then the input (Vin) is multiplied by the gain factor "a" and a reference voltage (Vref) is subtracted by the adder 26 to provide the residue, Vx=a Vin–Vref. Finally, if the input signal is between VL and VH (Region 2), then the input signal (Vin) is multiplied by the gain factor "a" and added to "0" at the adder 26 to provide the residue, Vx=a Vin. The resulting residue voltage Vout 27 is shown graphically in FIG. 2(b). The resulting signal or residue is then passed to the next RSD stage (e.g., 12) which performs the same operation and passes its residue back to first RSD stage (e.g., 11). This process continues until all of the bit decisions have been made. Meanwhile, the Dout bits are aligned and synchronized and then recombined in the digital section of the ADC to realize a standard format binary output code.

Depending on the circuit implementation details for each RSD stage, there are advantages to this architecture in terms of immunity to linearity errors caused by comparator offset and opamp offset. The dashed line 28 in FIG. 2(b) demonstrates the effect of offsets on an RSD stage. Comparator offsets and loop (operational amplifier) offsets that result in an overall shift in the transfer function are shown. Note that neither type of offset causes the residue voltage (Vout) to fall outside the valid range, resulting in no missing or redundant codes result and thus leaving linearity unaffected. As seen in FIG. 2(b), it can be seen that the decision levels VL and VH can vary over a very wide range without introducing missing or redundant codes, or corresponding degradations in linearity. Therefore, errors due to comparator offsets are effectively eliminated, enabling a very simple high speed realization for the comparator, and also allowing the comparator to make a decision while the rest of the stage is still settling. Consequently, the ADC can be configured such that each bit decision requires half a clock cycle, and a full 10 bit conversion only five clock cycles. With comparator limitations thus removed, conversion speed is limited solely by the settling time of the operational amplifier (opamp) used in the "a" gain stage.

Figure 3:
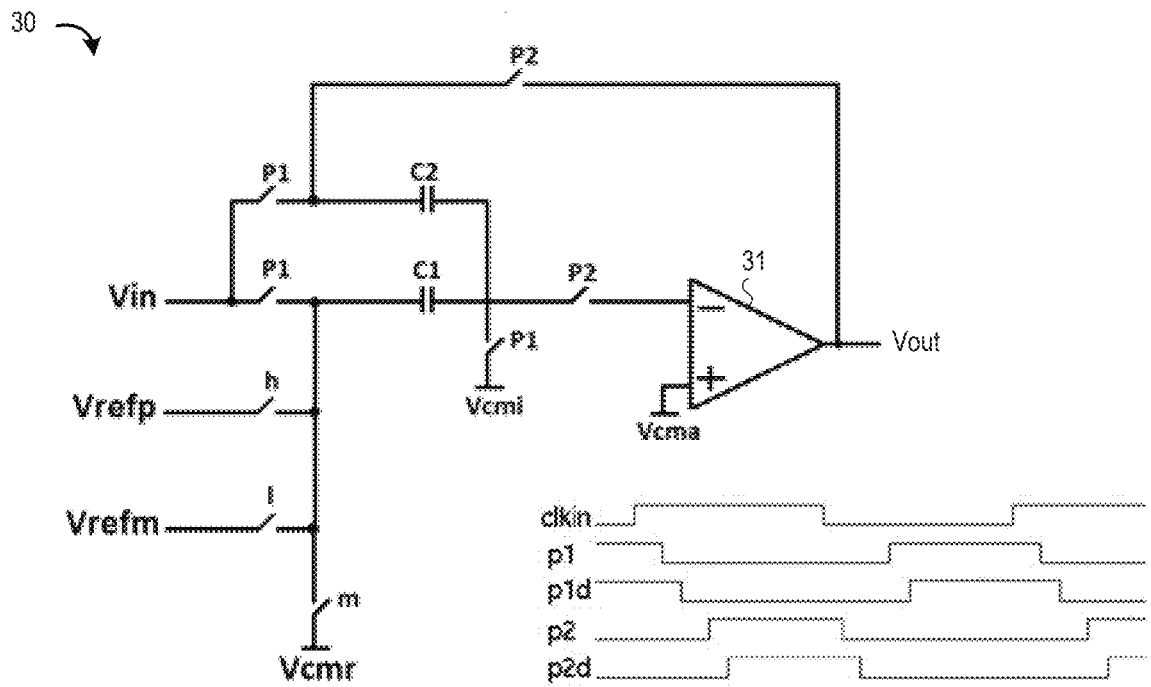
FIG. 3 is a simplified circuit diagram illustrating a 1.5b RSD stage.

To provide additional details for an improved understanding of the limitations of conventional RSD stage designs, reference is now made to FIG. 3 which is a simplified circuit diagram illustrating a 1.5 bit RSD stage 30 which includes an input node (Vin) for receiving an input voltage signal and output node (Vout) for providing a residue voltage derived from the input voltage signal. RSD stage 30 also includes a first reference node (Vrefp) for a first reference voltage, and a second reference node (Vrefm) for a second reference voltage. These inputs Vin, Vrefp, Vrefm are connected across switched capacitors C1, C2 to an operational amplifier 31 under control of digital switching logic and clock generator circuitry (not shown) that generates switch control signals (h, l, m) and a clock signal having non-overlapping clock phases P1, P2.

Operation of the ADC RSD stage 30 is known to those skilled in the art and will therefore not be described in detail other than to note that the switches are labeled with their respective governing clock/control signals such that, when a clock/control signal is high, the associated switch is closed, and when a clock/control signal is low, the associated switch is open. In particular, when the sampling phase P1 clock signal is high and the gain phase P2 clock signal is low, the C1 and C2 capacitors charge to sample the input voltage applied to input node Vin. When the P1 clock signal is low and the P2 clock signal is high, the C1 and C2 capacitors are coupled to amplifier 31, which generates an output residue voltage (Vout). In addition, one of the h, l, or m switches is closed during P2 depending upon the results of comparing the input voltage present at input node Vin relative to a high voltage reference (VH) and a low voltage reference (VL), as discussed above. If the h switch is closed during the gain phase when the P1 clock signal is low and the P2 clock signal is high, then the Vrefp is subtracted from the output voltage (e.g., aVin) that would otherwise be generated at output node Vout. However, if the l switch is closed during the gain phase, then Vrefm is subtracted from the output voltage that would otherwise be generated at output node Vout. If the m switch is closed during the gain phase, then only the C1 and C2 capacitors contribute to the output voltage at output node Vout. In a typical ADC implementation, Vrefp is a positive reference voltage, Vrefm is a negative reference voltage having the same or different absolute magnitude as Vrefp, and the C1 and C2 capacitors have equal capacitance. Under those conditions, the output voltage at output node Vout will be twice the input voltage (e.g., Vout=2Vin) when the m switch is closed, and the output voltage will be modified, respectively, by the addition or subtraction of Vrefm or Vrefp when the l or h switches are closed. Thus, at phase P1, the input (Vin) is sampled, and at phase P2, the residue voltage Vout is generated from Vrefp, Vrefm, or Vcmr being added (or subtracted) from the sampled input which is gained with the ratio of (1+C1/C2) according to Equation 1:

$$\text{if } h = 1: V_o^{p2} = \left(V_{in}^{p1} Z^{-\frac{1}{2}} - V_{cmi}\right)\left(1 + \frac{C1}{C2}\right) - (V_{refp} - V_{cma})\left(\frac{C1}{C2}\right) + V_{cma}$$

$$\text{if } l = 1: V_o^{p2} = \left(V_{in}^{p1} Z^{-\frac{1}{2}} - V_{cmi}\right)\left(1 + \frac{C1}{C2}\right) - (V_{refm} - V_{cma})\left(\frac{C1}{C2}\right) + V_{cma}$$

$$\text{if } m = 1: V_o^{p2} = \left(V_{in}^{p1} Z^{-\frac{1}{2}} - V_{cmi}\right)\left(1 + \frac{C1}{C2}\right) - (V_{cmr} - V_{cma})\left(\frac{C1}{C2}\right) + V_{cma}$$

In Equation 1, the superscript terms (e.g., $V_o^{P2}$) specify that the signal value is defined for the sample phase (P1) or gain phase (P2). In addition, the "Z" term in the equations refers to the Z transform of the samples of Vin and in these equations, indicates when the input, Vin, was sampled referenced to when the output, Vo, was generated. For example, the equation term $V_o^{P2}$ indicates that the residue voltage (Vo) is generated during P2 (which is the phase when switches with P2 are closed), and the $Z^{(-\frac{1}{2})}$ term indicates that the input was sampled half a clock cycle earlier (meaning P1). Therefore, Vo (at P2) is generated from Vin which was sampled at P1. As will be understood, a reference to P1 being a half a cycle before P2 is made in reference to the main clock (clkin) from which non-overlapping clock phases P1 and P2 are generated.

As indicated above, the comparator and the op-amp offsets for an RSD stage, whether differential or single-ended, will not adversely impact linearity since neither offset causes the residue voltage Vout to fall outside the valid residue voltage range as shown in FIG. 2(b). However, during the P2 gain phase when the control signal m=1 indicates that input voltage Vin is in Region 2 (e.g., is greater than comparator's low threshold voltage and smaller than comparator's high threshold voltage), it is not required to shift the output voltage inside the voltage range $V_L$, $V_H$ by adding or subtracting Vrefp or Vrefm.

Figure 4:
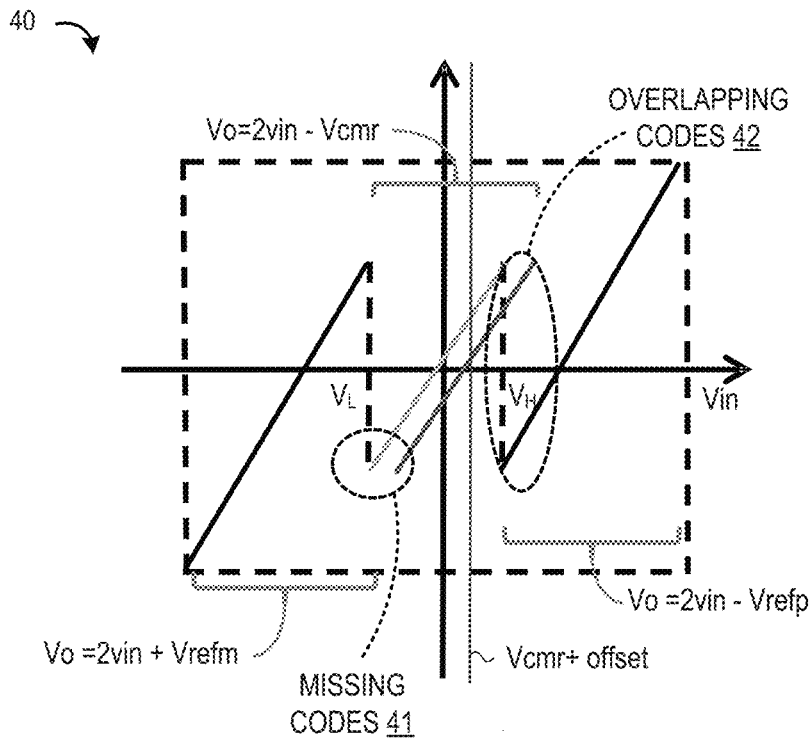
FIG. 4 diagrammatically depicts an output voltage waveform of a single-ended RSD stage with Vcmr offset.

In a fully differential structure, this can readily be accomplished by first disconnecting the differential reference inputs from their respective references (Vrefp and Vrefm) and then shorting them together, in which case the precise control of these references is not necessary, making the differential structure robust to the common-mode offset problem. However, in a single-ended structure, the algorithm functions properly only if the reference common mode (Vcmr) is precisely set to the midpoint of the Vrefp and Vrefm (i.e., Vcmr=(Vrefp+Vrefm)/2). If this precise midpoint setting requirement for Vcmr is not met, the Vcmr offset can result in missing codes 41 or redundant codes 42 and corresponding degradations in linearity, as illustrated in FIG. 4 which diagrammatically depicts an output voltage waveform 40 of a single-ended RSD stage with Vcmr offset.

Figure 5:
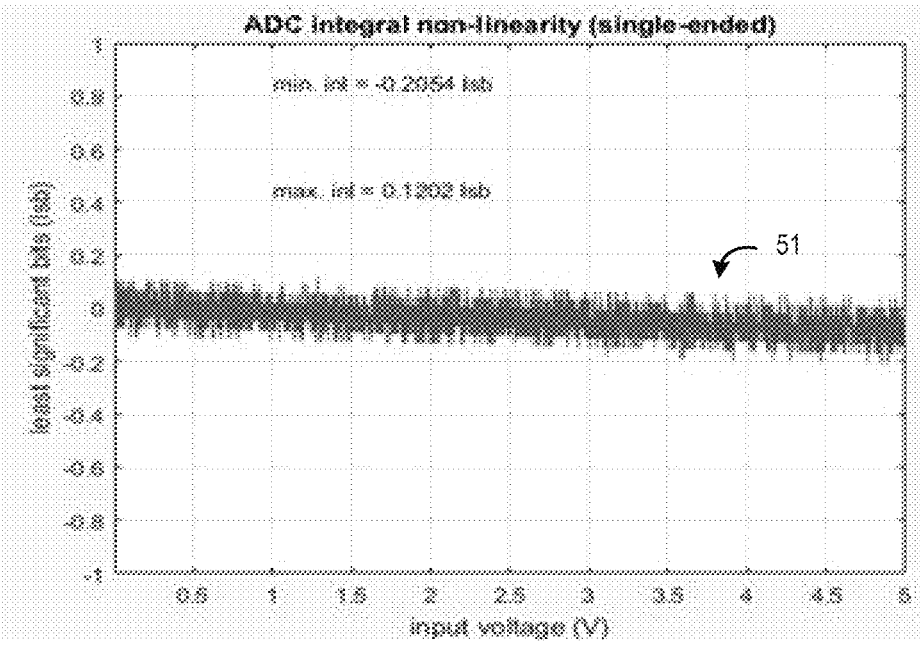
FIG. 5 is a simulated waveform depiction of an integral non-linearity signal of a single-ended RSD ADC implemented using a single-ended RSD stage with no Vcmr offset.
Figure 6:
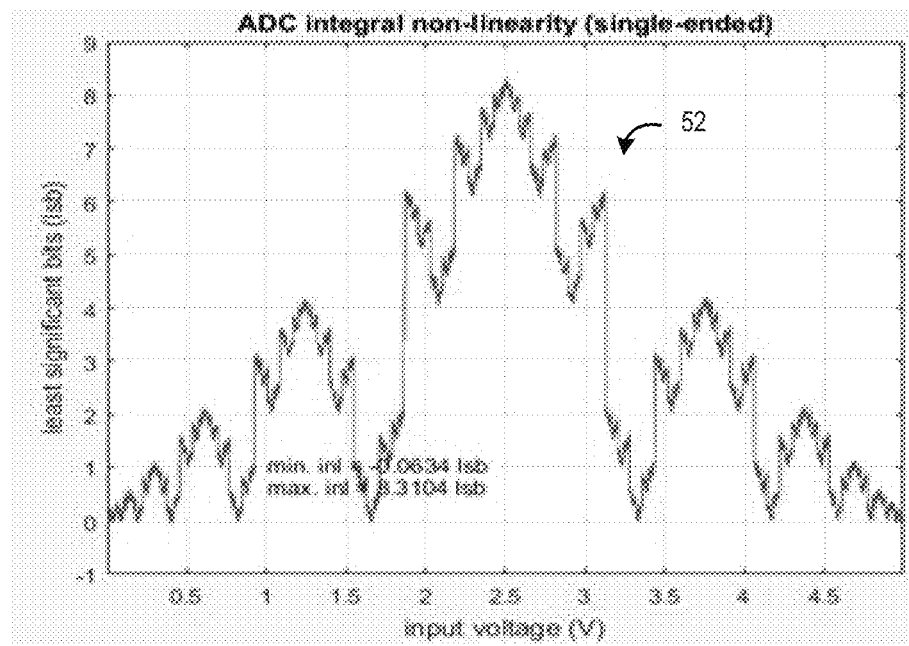
FIG. 6 is a simulated waveform depiction of an integral non-linearity of a single-ended RSD ADC implemented using a single-ended RSD stage with 10 mV Vcmr offset.

To illustrate the linearity impact from Vcmr offset, reference is now made to FIG. 5 which depicts a MATLAB simulated waveform of an integral non-linearity signal 51 of a single-ended cyclic ADC composed of two conventional 1.5 bit RSD stages 30 with no Vcmr offset. As shown with the simulated waveform 51, good linearity is obtained with the "no offset" scenario, achieving a minimum INL measure and maximum INL measure between +/−1 LSB. However, when a small Vcmr offset (e.g., 10 mV) is introduced into the simulation, the INL can be negatively impacted. To illustrate this, reference is now made to FIG. 6 which depicts a MATLAB simulated waveform of an integral non-linearity signal 52 in a single-ended cyclic ADC composed of two conventional 1.5 bit RSD stages 30 with Vcmr offset=10 mV. As shown with the simulated waveform 52, the linearity measure is severely degraded in the 10 mV offset scenario, achieving a minimum INL measure is −0.0634 LSB and the maximum INL measure is +8.3104 LSB. Given the goal of keeping the INL values below 1 (if not closer to 0), the effects of Vcmr offsets on device linearity can be quite significant, even from Vcmr offset values that are orders of magnitude smaller than the precise value of Vcmr.

Figure 7:
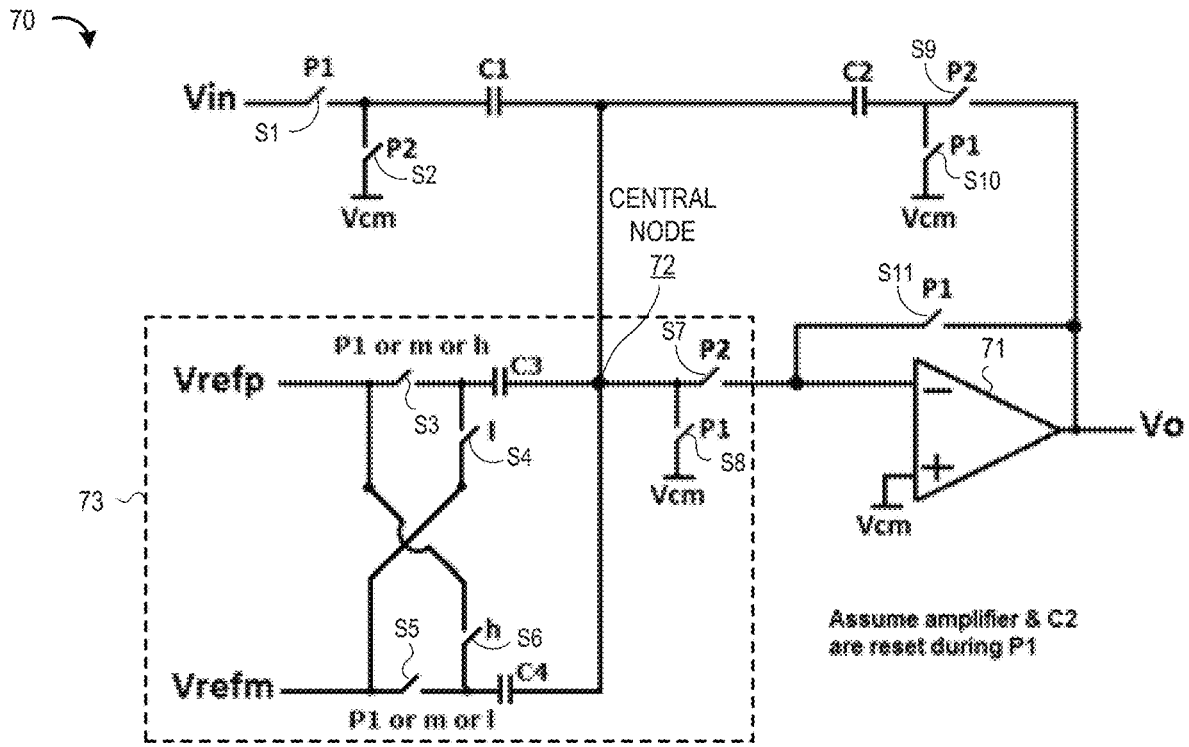
FIG. 7 is a simplified circuit diagram illustrating a single-ended 1.5 bit RSD stage employing a non-flip-around multiplying-DAC (MDAC) gain stage architecture for generating reference common mode voltage (Vcmr) from first and second reference voltages (Vrefp, Vrefm) in accordance with selected embodiments of the present disclosure.

To address these limitations and others associated with conventional switched-capacitor gain stage designs, reference is now made to FIG. 7 which provides simplified circuit diagram illustration of a single-ended 1.5 bit RSD stage 70 employing a non-flip-around multiplying-DAC (MDAC) gain stage architecture which uses switched capacitors C1-C4 to dynamically generate a reference common mode voltage (Vcmr) from first and second reference voltages (Vrefp, Vrefm) in accordance with selected embodiments of the present disclosure. As depicted, the RSD stage 70 includes input nodes for receiving an input voltage signal (Vin), a first reference voltage (Vrefp), and a second reference voltage (Vrefm). These inputs Vin, Vrefp, Vrefm are respectively connected across switched capacitors C1, C3, C4 to a central node 72 during a sampling phase (P1), depending upon the comparison of the input voltage present at input node Vin relative to a high voltage reference (VH) and a low voltage reference (VL). In particular, the first switched capacitor C1 samples the input voltage Vin, and the switched capacitors C3, C4 form a reference loading circuit 73 which, during a sampling phase (P1), samples Vrefp on second switched-capacitor C3 and Vrefm on third switched-capacitor C4, respectively, to central node 72 which is connected to the common-mode voltage Vcm through switch S8 during the sampling phase (P1), and then, during a gain phase (P2), selectively cross-connects the reference voltage inputs Vrefp, Vrefm across the switched capacitors C4, C3 to the central node 72, depending upon the comparison of the input voltage present at input node Vin relative to a high voltage reference (VH) and a low voltage reference (VL). The central node 72 is also selectively connected to receive the amplifier output (Vo) in feedback over a second switched capacitor C2 during the gain or residue phase (P2), with both sides of the second switched capacitor C2 being connected to the op-amp common mode voltage (Vcm) during the sampling phase (P1). With the non-inverting input of the op-amp 71 connected to the op-amp common mode voltage (Vcm) and with the inverting input connected to receive the amplifier output (Vo) in feedback during the sampling phase (P1) and to receive the central node 72 during the gain phase (P2), the residue or output voltage Vo is generated which has reduced sensitivity to Vcmr offset and capacitor mismatch. This is achieved by using switched capacitors C3, C4 as inputs to the op-amp 71 in the gain phase (P2) which are pre-charged during the sampling phase (P1) to Vrefp (C3) and Vrefm (C4) respectively, and which are then used during the gain phase to selectively generate "Vrefp−Vrefm" (when h=1 or l=1) or "Vrefp−Vrefp" and "Vrefm-Vrefm" (when m=1). This scheme eliminates the problem with the Vcmr offset and reduces the capacitor mismatch sensitivity.

As will be appreciated, the switched capacitors C1-C4 are connected to the op-amp 71 under control of digital switching logic and clock generator circuitry (not shown) that generates switch control signals (h, l, m) and a clock signal having non-overlapping clock phases P1, P2 as shown. The switches in the RSD stage 70 are labeled with their respective governing clock/control signals. In this example, when a clock/control signal is high, the associated switch is closed, and when a clock/control signal is low, the associated switch is open. Thus, when the P1 clock signal is high and the P2 clock signal is low, the first switched capacitor C1 charges to sample the input voltage applied to input node Vin, the second switched capacitor C2 is discharged since both sides are connected to the amplifier common-mode voltage (Vcm), the third switched capacitor C3 charges to sample the reference voltage Vrefp, and the fourth switched capacitor C4 charges to sample the reference voltage Vrefm. Conversely, when the P1 clock signal is low and the P2 clock signal is high during the gain phase, the first switched capacitor C1 is coupled to the inverting input of the amplifier 71 along with the output node Vo that is applied in feedback across the second switched capacitor C2, thereby generating an output residue voltage at output node Vo. In addition, the switches S3-S6 are selectively closed under control of switch control signals (h, l, m) during the gain stage P2 depending upon the comparison of the input voltage present at input node Vin relative to a high voltage reference (VH) and a low voltage reference (VL). The result of the comparison also determines the data values for digital output (e.g., Dout1), as discussed above. If the switches S3, S6 are closed when the switch control signal h=1 during the gain phase, when the P1 clock signal is low and the P2 clock signal is high, then Vrefp−Vrefm is subtracted from the amplifier output voltage that would otherwise be generated at output node Vo. If the switches S4, S5 are closed when the switch control signal l=1 during the gain phase, then Vrefp−Vrefm is added to the output voltage that would otherwise be generated at output node Vo. And if the switches S3, S5 are closed when the switch control signal m=1 during the gain phase, then Vrefp and Vrefm are connected across capacitors C3 and C4, respectively, to the central node 72 to contribute to the output voltage so that nothing is added to the voltage at output node Vo, generating a correct output voltage, Vo that has reduced sensitivity to Vcmr offset.

With the second switched capacitor C2 being half the size of the first switched capacitor C1 and twice as large as the third and fourth switched capacitor C3, C4 (e.g., C1/2=C2=2C3=2C4), the switched capacitors C3, C4 are connected during the sampling phase (P1) to be pre-charged to Vrefp (C3) and Vrefm (C4) respectively, and which are then used during the gain phase to selectively generate 'Vrefp−Vrefm' (when h=1 or l=1) or 'Vrefp−Vrefp' & 'Vrefm-Vrefm' (m=1), and are also connected during the gain phase (P2) to generate the common mode reference voltage Vcmr from the first and second reference voltages (Vrefp, Vrefm) so as to eliminate sensitivity to the Vcmr offset. In particular, this is accomplished by connecting the switched capacitors C3, C4 between the reference voltages Vrefp, Vrefm and the central node 72 and then to the amplifier common-mode voltage through switch S8 during the P1 sampling phase, and also during the P2 gain phase when the control signal m=1 (indicating that input voltage Vin is in Region 2), by connecting the switched capacitors C3, C4 between the reference voltage Vrefm and the central node 72 during the P2 gain phase when the control signal l=1 (indicating that input voltage Vin is in Region 1), and by connecting the switched capacitors C3, C4 between the reference voltage Vrefp and the central node 72 during the P2 gain phase when the control signal h=1 (indicating that input voltage Vin is in Region 3). The resulting residue voltage transfer functions are given by Equation 2:

$$@h = 1: V_o^{p2} =$$
$$\left(V_{in}^{p1} Z^{\frac{-1}{2}} - V_{cm}\right)\left(\frac{C1}{C2}\right)(Gfg) - (V_{refp} - V_{refm})\left(\frac{C4}{C2}\right)(Gfg) + V_{cm} \cdot Gfg$$

$$@m = 1: V_o^{p2} = \left(V_{in}^{p1} Z^{\frac{-1}{2}} - V_{cm}\right)\left(\frac{C1}{C2}\right)(Gfg) -$$
$$(V_{refp} - V_{refp})\left(\frac{C3}{C2}\right)(Gfg)(V_{refm} - V_{refm})\left(\frac{C4}{C2}\right)(Gfg) + V_{cm} \cdot Gfg$$

$$@l = 1: V_o^{p2} = \left(V_{in}^{p1} Z^{\frac{-1}{2}} - V_{cm}\right)\left(\frac{C1}{C2}\right)(Gfg) +$$
$$(V_{refp} - V_{refm})\left(\frac{C3}{C2}\right)(Gfg) + V_{cm} \cdot Gfg$$

where $$Gfg = \frac{A_v \beta}{1 + A_v \beta},$$

assuming that the capacitor values C1=2C2=4C3=4C4.

Figure 8:
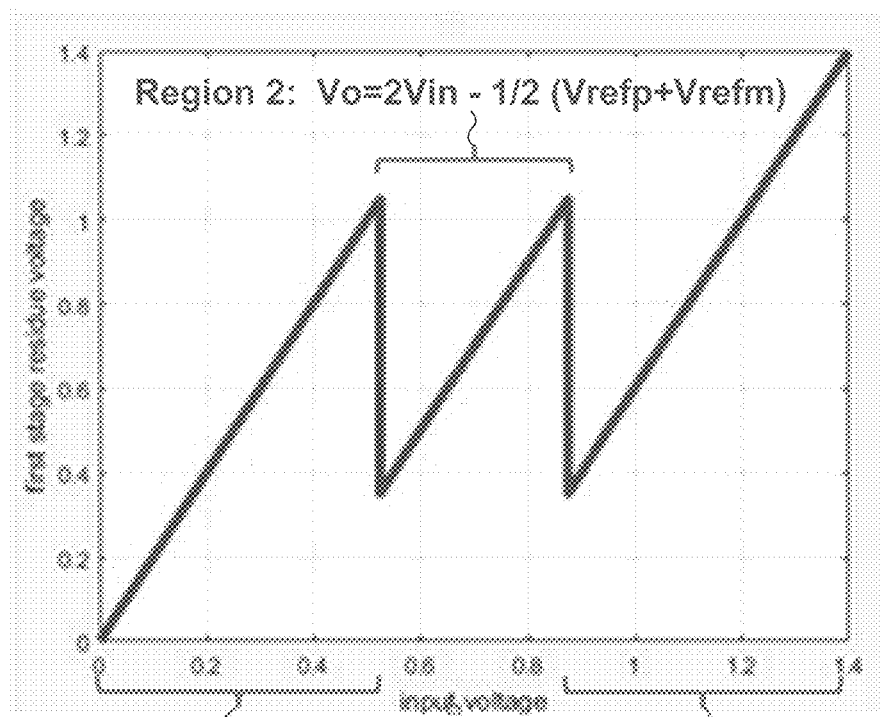
FIG. 8 diagrammatically depicts an output voltage waveform of the single-ended 1.5 bit RSD stage shown in FIG. 7.

As seen from the foregoing, any inaccuracy in the absolute value of the reference voltages (Vrefp, Vrefm, and Vcm) compresses or shifts each of the Equation 2 transfer functions, and therefore does not affect the linearity of the circuit. For example, an error in the Vcma term will shift the residue voltage for all three regions by a similar amount. And by substitution of the capacitor values C1=2C2=−4C3=−4C4, the Equation 2 transfer function results in the output waveform 80 Vout shown in FIG. 8 wherein the output voltage Vout for Region 1 (where the input signal is less than VL) is Vout=2Vin+(Vrefp−Vrefm), the output voltage Vout for Region 3 (where the input signal is greater than VH) is Vout=2Vin−(Vrefp+Vrefm), and where the output voltage Vout for Region 2 (where the input signal is between VL and VH) is Vout=2Vin.

Figure 9:
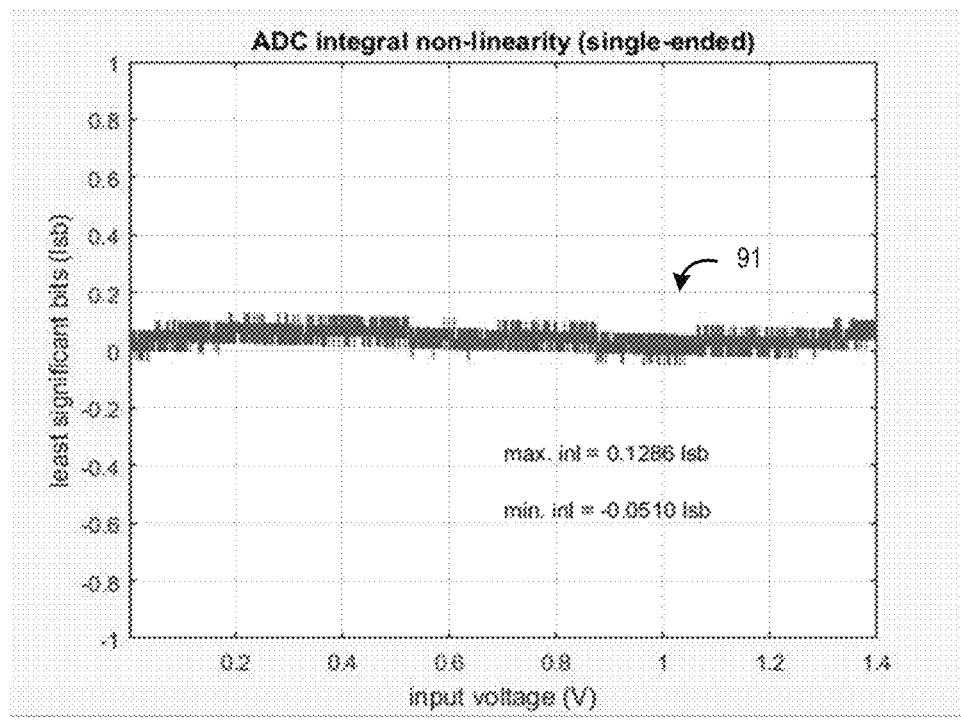
FIG. 9 is a simulated waveform depiction of an integral non-linearity signal of a single-ended RSD ADC implemented using a single-ended 1.5 bit RSD stage shown in FIG. 7 with a first set of reference voltages (Vrefp, Vrefm) and no offset.
Figure 10:
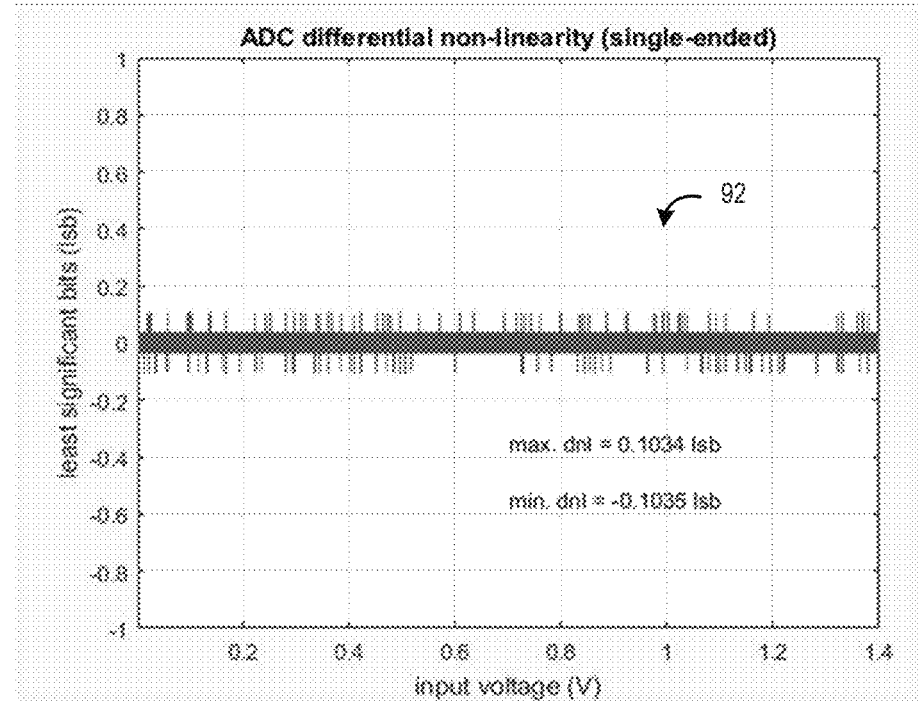
FIG. 10 is a simulated waveform depiction of a differential non-linearity signal of a single-ended RSD ADC implemented using a single-ended 1.5 bit RSD stage shown in FIG. 7 with a first set of reference voltages (Vrefp, Vrefm) and no offset.
Figure 11:
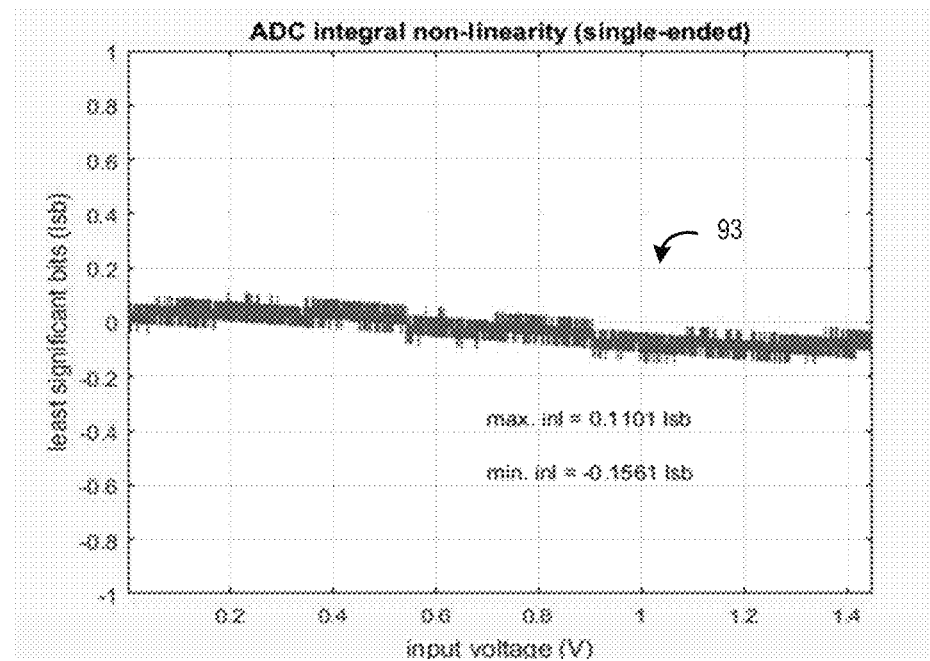
FIG. 11 is a simulated waveform depiction of an integral non-linearity signal of a single-ended RSD ADC implemented using a single-ended 1.5 bit RSD stage shown in FIG. 7 with a second set of reference voltages (Vrefp, Vrefm) and a first offset from a first reference voltage (Vrefp).
Figure 12:
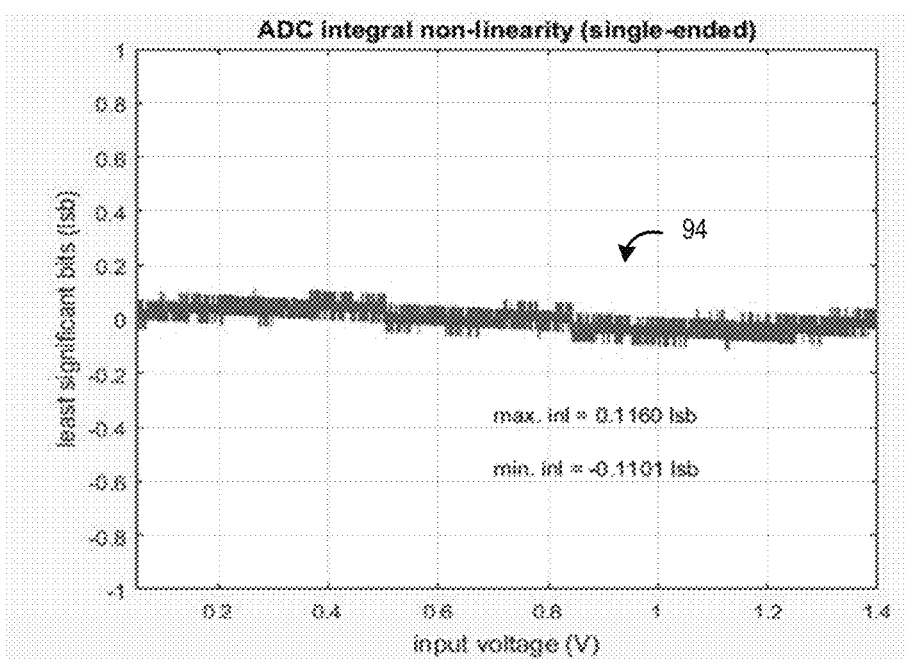
FIG. 12 is a simulated waveform depiction of an integral non-linearity signal of a single-ended RSD ADC implemented using a single-ended 1.5 bit RSD stage shown in FIG. 7 with a third set of reference voltages (Vrefp, Vrefm) and a first offset from a second reference voltage (Vrefm).

To illustrate the linearity impact from generating the Vcmr by selectively applying the first and second reference voltages (Vrefp, Vrefm) to the switched capacitors C3, C4 in both the sampling and gain phase s (P1, P2), reference is now made to FIG. 9 which depicts a MATLAB simulated waveform of an integral non-linearity signal 91 in a single-ended cyclic ADC composed of two 1.5 bit RSD stages 70 with a first set of reference voltages (Vrefp=1.4V, Vrefm=0V) and no offset. As shown with the simulated waveform 91, good linearity (<1) is obtained with the "no offset" scenario, achieving a minimum INL measure and maximum INL measure between +/−1 LSB. In addition, good differential linearity is obtained for the "no offset" scenario, as illustrated with FIG. 10 which depicts a MATLAB simulated waveform of a differential integral non-linearity signal 92 in a single-ended cyclic ADC composed of two 1.5 bit RSD stages 70 which achieve a minimum DNL measure and maximum DNL measure between +/−1 LSB. Likewise, good linearity (<1) is obtained when a small offset (e.g., 50 mV) from a first reference voltage (Vrefp) is introduced into the simulation, as illustrated with FIG. 11 which depicts a MATLAB simulated waveform of an integral non-linearity signal 93 in a single-ended cyclic ADC composed of two 1.5 bit RSD stages 70 with a second set of reference voltages (Vrefp=1.4V, Vrefm=0V) and a first 50 mV offset from a first reference voltage (Vrefp). As shown with the simulated waveform 93, a good linearity measure in the 50 mV offset scenario achieved, achieving a minimum INL measure and maximum INL measure between +/−1 LSB. In addition, it can be seen that good linearity (<1) is obtained when an offset (e.g., 50 mV) from a second reference voltage (Vrefm) is introduced into the simulation, as illustrated with FIG. 12 which depicts a MATLAB simulated waveform of an integral non-linearity signal 94 in a single-ended cyclic ADC composed of two 1.5 bit RSD stages 70 with a third set of reference voltages (Vrefp=1.4V, Vrefm=0V) and a first 50 mV offset from a second reference voltage (Vrefm), achieving a minimum INL measure and maximum INL measure between +/−1 LSB.

Figure 13:
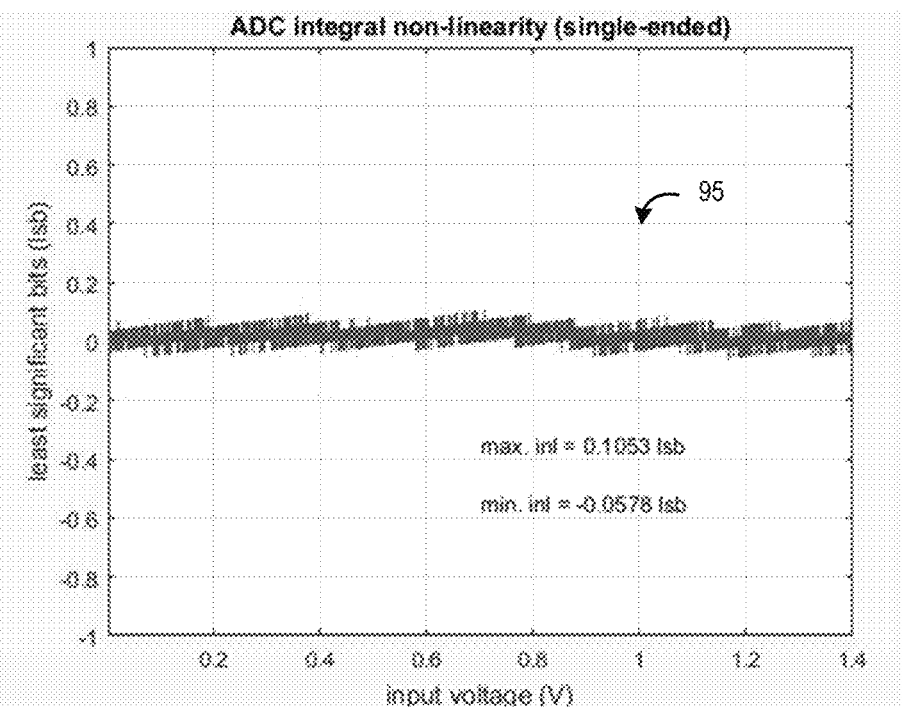
FIG. 13 is a simulated waveform depiction of an integral non-linearity signal of a single-ended RSD ADC implemented using a single-ended 1.5 bit RSD stage shown in FIG. 7 with a first maximum mismatch between the capacitors setting the voltage gain.
Figure 14:
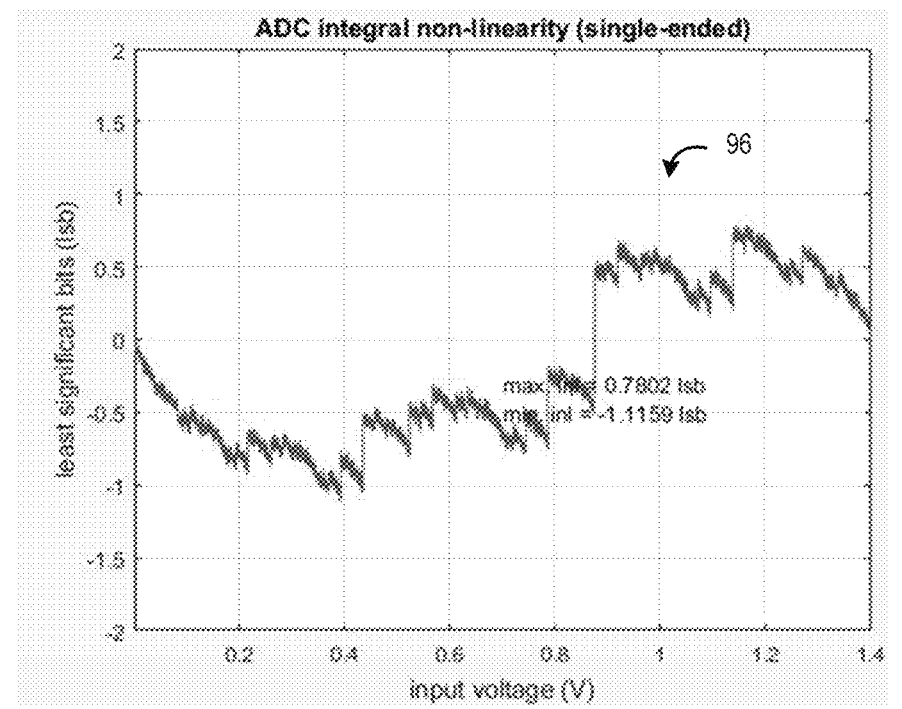
FIG. 14 is a simulated waveform depiction of an integral non-linearity signal of a single-ended RSD ADC implemented using a single-ended 1.5 bit RSD stage shown in FIG. 7 with a second maximum mismatch between the capacitors setting the voltage gain.

In addition to reducing Vcmr offset-based non-linearities, the use of switched capacitors C3, C4 in all conditions of the gain/residue phase P2 (h=1 or l=1 or m=1) also helps greatly reduce the sensitivity to the capacitor mismatch which can also be a possible source of non-linearity. To illustrate that the linearity of the switched capacitor RSD ADCs is tolerant to mismatch between the capacitors that set the voltage gain, reference is now made to FIG. 13 which depicts a MATLAB simulated waveform of an integral non-linearity signal 95 in a single-ended cyclic ADC composed of two 1.5 bit RSD stages 70 with a first, relatively small mismatch between the capacitors setting the voltage gain. As shown with the simulated waveform 95, good linearity is obtained with a maximum capacitor mismatch of 0.005%, achieving a minimum INL measure and maximum INL measure between +/−1 LSB. Even when a larger capacitor mismatch (e.g., 0.05%) is introduced into the simulation, the INL is not negatively impacted. To illustrate this, reference is now made to FIG. 14 which depicts a MATLAB simulated waveform of an integral non-linearity signal 96 in a single-ended cyclic ADC composed of two 1.5 bit RSD stages 70 with a second, larger mismatch between the capacitors setting the voltage gain. As shown with the simulated waveform 96, decent linearity measure is still achieved with the larger capacitor mismatch (e.g., 0.05%) scenario, achieving a minimum INL measure is −1.1159 LSB and the maximum INL measure is +0.7802 LSB. Given the goal of keeping the INL values below 1.5 LSB (if not closer to 0), the effects of capacitor mismatch on device linearity is still tolerable, even if not ideal. In a 12$b$ RSD ADC, the sensitivity to the capacitor mismatch is reduced to 11.2-bit levels which is only slightly (1.02×) more stringent than the requirement for any RSD stage (i.e., 11 bit matching is required for any RSD ADC with 12-bit resolution).

There are a number of benefits from the non-flip-around multiplying-DAC (MDAC) gain stage architecture 70 which uses switched capacitors C3, C4 in both the sampling and gain phases (P1, P2) in terms of the minimum required DC gain and Unity Gain Bandwidth (UGBW) requirements. For example, the disclosed non-flip-around stage has a relatively low feedback factor which imposes higher demands on the op-amp 71, but by using a two-stage amplifier to optimize the phase margin (for a critically damped response with a phase margin of less than 60°), the required settling is easily achievable. This is particularly advantageous in low power applications while achieving the required gain and output swing. In addition, if the ADC MDAC stages are required to process rail-to-rail inputs and outputs and/or needed higher performance amplifiers (which is more challenging specifically in small process node technologies with low supply voltages), a correlated double-sampling (CDS) or correlated level shifting (CLS)-based amplifier could be used, such as described in U.S. Pat. No. 8,487,803 or 8,400,339. As a result, offset and 1/f noise will be reduced and a simple low open-loop gain op-amp can be used.

However, it can be seen that the non-flip-around multiplying-DAC (MDAC) gain stage architecture 70 has unequal loading on the reference voltages (Vrefp, Vrefm), as illustrated with the table below:

reference loading circuit 100 which may be used in a mismatch and reference common-mode offset insensitive single-ended 1.5 bit RSD stage in which the reference sampling capacitors C3, C4 are pre-charged to the same values during the sampling stage (P1). As depicted, the reference loading circuit 100 may be used in a non-flip-around multiplying-DAC (MDAC) architecture, and may include input nodes for receiving a first reference voltage (Vrefp) and a second reference voltage (Vrefm). These inputs Vrefp, Vrefm are respectively connected across pre-charge circuitry 101 and switched capacitors C3, C4 to a central node 102 during a sampling phase (P1), depending upon the values of the switch control signals (h, l, m).

In particular, the precharge circuitry 101 includes a first capacitor pair Cc, Cd connected via switches S10-S14 in a precharge configuration to the first reference voltage (Vrefp), and second capacitor pair Ce, Cf connected via switches S15-S19 in a precharge configuration to the second reference voltage (Vrefm), where the capacitance values are all equal to a common value C (e.g., Cc=Cd=Ce=Cf=C3=C4=C). As shown, the reference voltages and pre-charge circuitry 101 are selectively cross-connected over the switches S3-S6 and capacitors C3, C4 to the central node 102, effectively replacing the reference loading circuit 73 in the RSD stage 70 shown in FIG. 7.

By controlling the switches S10-S19 of the pre-charge circuitry 101 with the sampling phase clock signal (P1) and the switch control signals (h, l, m) of the gain phase (P2), the first and second capacitor pairs Cc, Cd, Ce, Cf are connected equalize reference loading during the sampling phase (P1). In particular, the combined reference loading for the first reference voltage (Vrefp Load=Cc+Cd+C3=3C) is equal to the combined reference loading for the second reference voltage (Vrefm Load=Ce+Cf+C4=3C). In addition, the first and second capacitor pairs Cc, Cd, Ce, Cf are connected to provide equalized reference loading during each region of the gain phase (P2). In particular, when the switch control signal h=1 of the gain phase (P2) (e.g., Region 3), the reference loading for the first reference voltage (Vrefp) pre-charges switched capacitor C3 to Vrefp and pre-charges the switched capacitor C4 to Vrefm, while the reference

| Reference loading | | P2 | | |
|---|---|---|---|---|
| (FIG. 17) | P1 | h = 1 | l = 1 | m = 1 |
| Vrefp load | C3 | C3 precharged to Vrefp<br>C4 precharged to Vrefp | 0 | C3 precharged to Vrefp |
| Vrefm load | C4 | 0 | C3 precharged to Vrefm<br>C4 precharged to Vrefm | C4 precharged to Vrefm |

As seen from the forgoing, there is unequal reference loading during the residue generation stage (P2). This can result in performance limitations, such as limiting the achievable ADC performance or placing extreme demands on the reference buffers.

Figure 15:
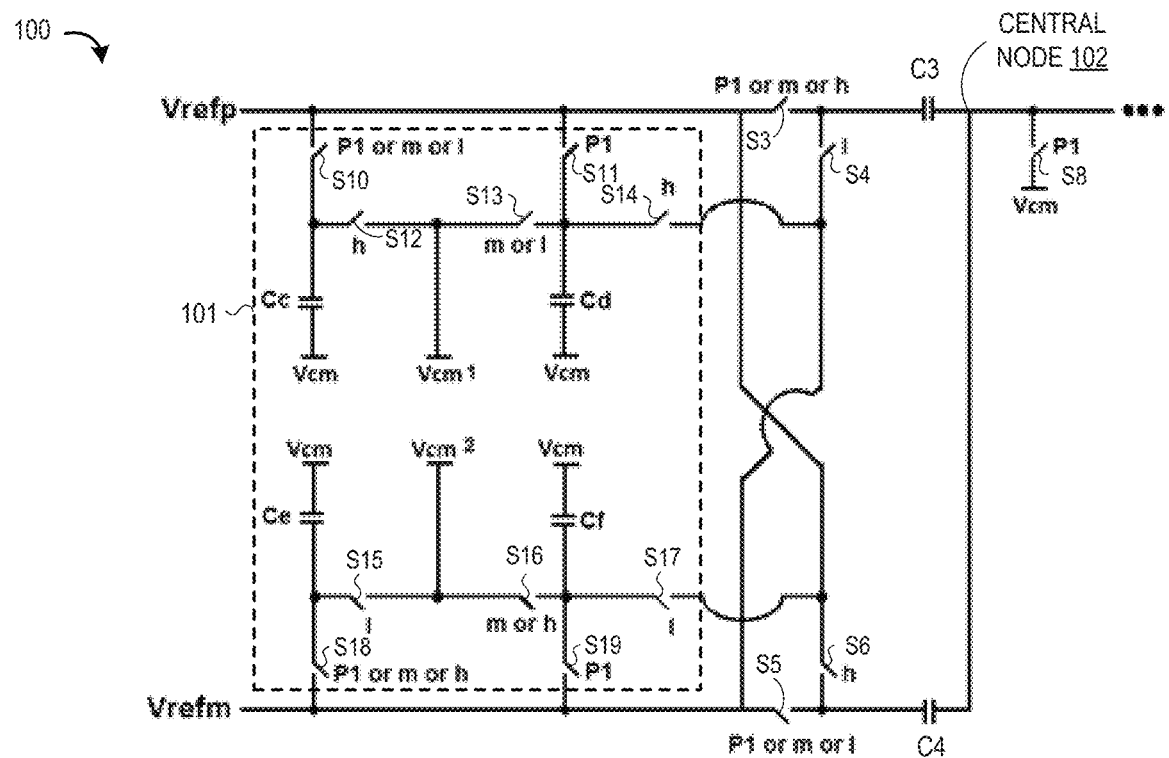
FIG. 15 is a simplified circuit diagram illustration of a reference loading circuit which may be used in a mismatch and reference common-mode offset insensitive single-ended 1.5 bit RSD stage employing a non-flip-around multiplying-DAC (MDAC) architecture in which the reference sampling capacitors are pre-charged to the same values during the sampling stage in accordance with selected embodiments of the present disclosure.

To address the performance limitations arising from unequal reference loading, the RSD stage may use a reference loading circuit in which the reference sampling capacitors are pre-charged to the same values (i.e., Vrefp or Vrefm) so that the charge drawn from the references during the residue generation stage (P2) will always be the same, thereby limiting the distortion that might be caused by unequal reference settling. To illustrate an example embodiment of this solution, reference is now made to FIG. 15 which depicts a simplified circuit diagram illustration of a loading for the second reference voltage (Vrefm) pre-charges switched capacitor Cd to Vrefp and pre-charges the switched capacitor Ce to Vrefm. In addition, when the switch control signal l=1 of the gain phase (P2) (e.g., Region 1), the reference loading for the first reference voltage (Vrefp) pre-charges switched capacitor Cc to Vrefp and pre-charges the switched capacitor Cf to Vrefm, while the reference loading for the second reference voltage (Vrefm) pre-charges switched capacitor C3 to Vrefp and pre-charges the switched capacitor C4 to Vrefm.

Finally, when the switch control signal m=1 of the gain phase (P2) (e.g., Region 2), the reference loading for the first reference voltage (Vrefp) pre-charges switched capacitor C3 to Vrefp and pre-charges the switched capacitor Cc to Vrefm, while the reference loading for the second reference voltage (Vrefm) pre-charges switched capacitor Cd to Vrefp and pre-charges the switched capacitor C4 to Vrefm. To illustrate that the reference loading circuit 101 has equal loading on the reference voltages (Vrefp, Vrefm), see the table below:

| Equalized reference loading (FIG. 15) | P1 | P2 | | |
|---|---|---|---|---|
| | | h = 1 | l = 1 | m = 1 |
| Vrefp load | C3 + Cc + Cd = 3C | C3 precharged to Vrefp<br>C4 precharged to Vrefm | Cc precharged to Vrefp<br>Cf prechargedto Vrefm | C3 precharged to Vrefp<br>Cc precharged to Vrefp |
| Vrefm load | C4 + Ce + Cf = 3C | Cd precharged to Vrefp<br>Ce precharged to Vrefm | C3 precharged to Vrefp<br>C4 precharged to Vrefm | Cd precharged to Vrefm<br>C4 precharged to Vrefm |

As shown in this table, the reference voltages (Vrefp, Vrefm) are always loaded by the same amount of capacitance during the sampling phase (P1) when the capacitance values are all equal to a common value C (e.g., Cc=Cd=Ce=Cf=C3=C4=C). And in the gain phase (P2), the capacitors are pre-charged in the same manner (i.e., one to Vrefp and one to Vrefm) when h=1 or l=1, while for the case when m=1, each reference is loaded by two capacitors that have been pre-charged to the same value as the reference they are connected to. In this manner, the charge drawn from the references, Vrefp and Vrefm during residue generation will always be the same. As will be appreciated, the switched capacitors Cc and Ce could be swapped during m=1 if needed.

Figure 16:
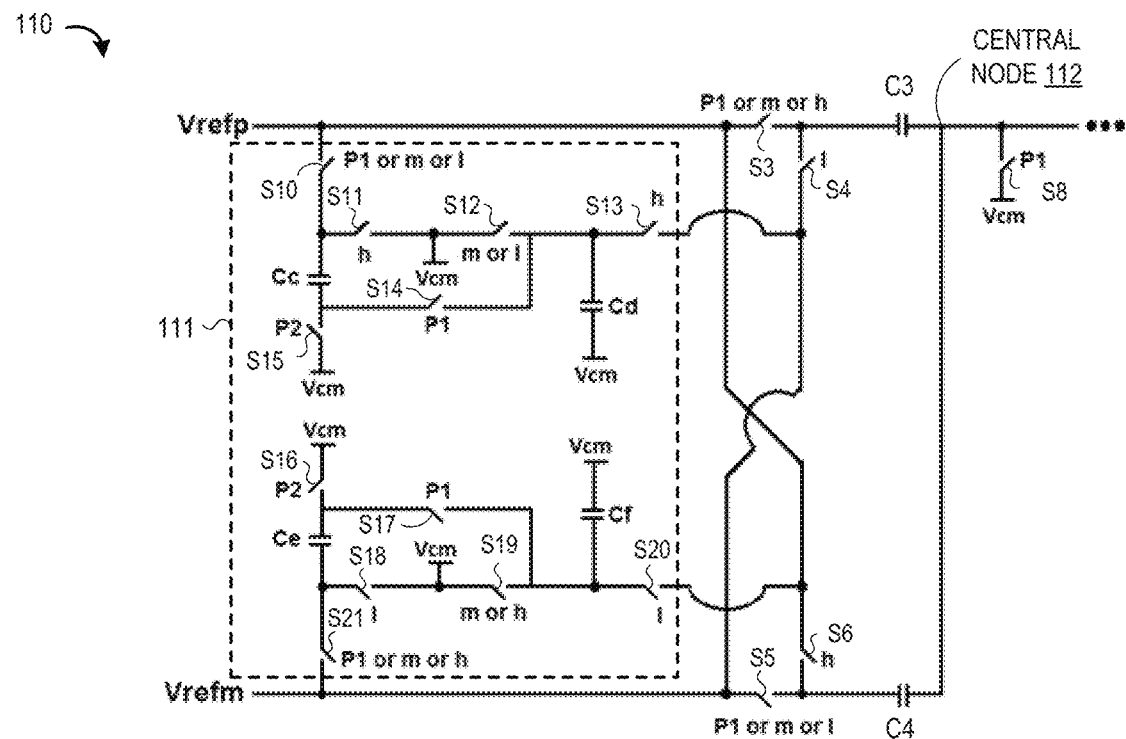
FIG. 16 depicts a simplified circuit diagram illustrating a reference loading circuit which may be used in a mismatch and reference common-mode offset insensitive single-ended 1.5 bit RSD stage employing a non-flip-around multiplying-DAC (MDAC) architecture in which the reference sampling capacitors are pre-charged to the same values during the sampling and gain phases in accordance with selected embodiments of the present disclosure.

Another approach for addressing unequal reference loading is for the RSD stage to use a reference loading circuit where the loading of references is equalized at the sampling phase (P1) to that of the gain phase (P2). To illustrate an example embodiment of this solution, reference is now made to FIG. 16 which depicts a simplified circuit diagram illustration of a reference loading circuit 110 which may be used in a mismatch and reference common-mode offset insensitive single-ended 1.5 bit RSD stage in which the reference sampling capacitors C3, C4 are pre-charged to the same values during the sampling and gain phases (P1, P2). As depicted, the reference loading circuit 110 may be used in a non-flip-around multiplying-DAC (MDAC) architecture, and may include input nodes for receiving a first reference voltage (Vrefp) and a second reference voltage (Vrefm). These inputs Vrefp, Vrefm are respectively connected across pre-charge circuitry 111 and switched capacitors C3, C4 to a central node 112 during a sampling phase (P1), depending upon the values of the switch control signals (h, l, m).

In particular, the pre-charge circuitry 111 includes a first capacitor pair Cc, Cd connected via switches S10-S15 in a pre-charge configuration to the first reference voltage (Vrefp), and second capacitor pair Ce, Cf connected via switches S16-S21 in a pre-charge configuration to the second reference voltage (Vrefm), where the capacitance values are all equal to a common value C (e.g., Cc=Cd=Ce=Cf=C3=C4=C). As shown, the reference voltages and pre-charge circuitry 111 are selectively cross-connected over the switches S3-S6 and capacitors C3, C4 to the central node 112, effectively replacing the reference loading circuit 73 in the RSD stage 70 shown in FIG. 7.

By controlling the switches S10-S21 of the pre-charge circuitry 111 with the sampling phase clock signal (P1) and the switch control signals (h, l, m) of the gain phase (P2), the first and second capacitor pairs Cc, Cd, Ce, Cf are connected to equalize the loading on the references in the sampling phase (P1) and gain phase (P2). In particular, the combined reference loading for the first reference voltage (Vrefp Load=C3||Cc+Cd=2C) is equal to the combined reference loading for the second reference voltage (Vrefm Load=C4||Ce+Cf=2C). In addition, the first and second capacitor pairs Cc, Cd, Ce, Cf are connected to provide equalized reference loading during each region of the gain phase (P2). In particular, when the switch control signal h=1 of the gain phase (P2) (e.g., Region 3), the reference loading for the first reference voltage (Vrefp) pre-charges switched capacitor C3 to Vrefp and pre-charges the switched capacitor C4 to Vrefm, while the reference loading for the second reference voltage (Vrefm) pre-charges switched capacitor Cd to Vrefp/2 and pre-charges the switched capacitor Ce to Vrefm/2. In addition, when the switch control signal l=1 of the gain phase (P2) (e.g., Region 1), the reference loading for the first reference voltage (Vrefp) pre-charges switched capacitor Cc to Vrefp/2 and pre-charges the switched capacitor Cf to Vrefm/2, while the reference loading for the second reference voltage (Vrefm) pre-charges switched capacitor C3 to Vrefp and pre-charges the switched capacitor C4 to Vrefm. Finally, when the switch control signal m=1 of the gain phase (P2) (e.g., Region 2), the reference loading for the first reference voltage (Vrefp) pre-charges switched capacitor C3 to Vrefp and pre-charges the switched capacitor Cc to Vrefp/2, while the reference loading for the second reference voltage (Vrefm) precharges switched capacitor Cd to Vrefm/2 and precharges the switched capacitor C4 to Vrefm. To illustrate that the reference loading circuit 111 has equal loading on the reference voltages (Vrefp, Vrefm), see the table below:

| Equalized reference loading (FIG. 16) | P1 | P2 | | |
|---|---|---|---|---|
| | | h = 1 | l = 1 | m = 1 |
| Vrefp load | C3&Cc + Cd = 2C | C3 precharged to Vrefp<br>C4 precharged to Vrefm | Cc precharged to Vrefp/2<br>Cf precharged to Vrefm/2 | C3 precharged to Vrefp<br>Cc precharged to Vrefp/2 |
| Vrefm load | C4&Ce + Cf = 2C | Cd precharged to Vrefp/2<br>Ce precharged to Vrefm/2 | C3 precharged to Vrefp<br>C4 precharged to Vrefm | Cd precharged to Vrefm/2<br>C4 precharged to Vrefm |

As shown in this table, the reference voltages (Vrefp, Vrefm) are always loaded by the same amount of capacitance during the sampling phase (P1) and the gain phase (P2) when the capacitance values are all equal to a common value C. In the gain phase (P2), the capacitors are pre-charged in the same manner (i.e., one to Vrefp and one to Vrefp/2 and one to Vrefm) and one to Vrefm/2 when h=1 or l=1, while for the case when m=1, each reference is loaded by two capacitors that have been pre-charged to the same value as the reference they are connected to or that value divided by 2. In this manner, the capacitive loading of each reference is the same for both the sampling phase (P1) and the gain phase (P2), but the capacitors are not all pre-charged to the same value.

As disclosed herein, the single-ended non-flip-around architectures can be implemented as switched capacitor gain stages without any limitation on the resolution of the stage. To provide additional details for an improved understanding of selected embodiments of the present disclosure, reference is now made to FIG. 17 which is a simplified circuit diagram illustrating a mismatch and reference common-mode offset insensitive single-ended 2.5 bit RSD stage 120 employing a non-flip-around MDAC architecture.

As depicted, the 2.5b RSD stage 120 includes a switched-capacitor gain stage circuit having a plurality of capacitors C1-C2, C3a-c, C4a-c and switches S1-S10 connected in a switching configuration including an input sampling circuit 121 and a plurality of reference loading circuits 122-124 connected to the central node 124. In turn, the central node 124 is selectively connected via switches S8-S9 to the op-amp common mode voltage (Vcm) during the sampling phase (P1) and to an inverting input of op-amp 125 during the gain phase (P2).

In this configuration, the RSD stage 120 includes an input node (Vin) for receiving an input voltage signal. Using switches S4-S5, S8-S9, the input voltage Vin is connected across switched capacitor C1 to the central node 124 which is in turn connected to the amplifier common-mode voltage (Vcm) via switch S9 during a sampling phase (P1), and is then disconnected during the gain phase (P2) when the central node 124 is connected to the inverting input of the op-amp 125. The plurality of reference loading circuits 122-124 have their respective switches S1a-d, S2a-d, S3a-d controlled by switch control signals (h, l, m) generated by a plurality of comparators (one for each region boundary) in a quantizer which determines in which of the 7 regions (described hereinbelow with reference to FIG. 18) the input to the stage resides. The h, l, and m quantizer outputs are then combined logically to generate the signals that operate the switches. In order to correctly control the switches S1a-d through S3a-d, the quantizer outputs are combined logically to generate one set of h, l, and m outputs for each of the reference loading circuits 122-124, namely h1, l1, and m1, h2, l2, and m2, and h3, l3, and m3. In the description below, the control signals that are set to a value of 1 are specifically indicated and all others (which are set to 0), are referred to as hx, lx or mx. In region 1, the quantizer outputs 000 generate switch control signals l1=l2=l3=1 and hx=mx=0. In region 2, the quantizer outputs 001 generate switch control signals l1=l2=1, and l3=hx=mx=0. In region 3, the quantizer outputs 010 generate switch control signals l1=1 and l2=l3=hx=mx=0. In region 4, the quantizer outputs 011 generate switch control signals m1=m2=m3=1 and lx=hx=0. In region 5, the quantizer outputs 100 generate switch control signals h1=1 and h2=h3=lx=mx=0. In region 6, the quantizer outputs 101 generate switch control signals h1=h2=1 and h3=lx=mx=0. And in region 7, the quantizer outputs 110 generate switch control signals h1=h2=h3=1 and lx=mx=0.

In a first reference loading circuit 122, the reference voltages Vrefp, Vrefm are respectively connected across switched capacitors C3a, C4a to the central node 124 (which is in turn connected to the amplifier common-mode voltage (Vcm) via switch S9) via switches S1a-d under control of the sampling phase clock signal (P1) or the switch control signals (h1 or l1 or m1) of the gain phase (P2). In particular, switch S1a is closed in response to the sampling phase clock signal (P1) or when the switch control signal h1=1 or m1=1 during the gain phase (P2). In addition, switch S1b is closed in response to the switch control signal l1=1 during the gain phase (P2), and switch S1c is closed in response to the switch control signal h1=1 during the gain phase. Finally, switch S1d is closed in response to the sampling phase clock signal (P1) or when the switch control signal l1=1 or m1=1 during the gain phase (P2).

In similar fashion, the first reference loading circuit 123 connects the reference voltages Vrefp, Vrefm across switched capacitors C3b, C4b to the central node 124 (which is in turn connected to the amplifier common-mode voltage (Vcm) via switch S9) via switches S2a-d under control of the sampling phase clock signal (P1) and the switch control signals (h2 or l2 or m2) of the gain phase (P2). In particular, switch S2a is closed in response to the sampling phase clock signal (P1) or when the switch control signal h2=1 or m2=1 during the gain phase (P2). In addition, switch S2b is closed in response to the switch control signal l2=1, and switch S2c is closed in response to the switch control signal h2=1 during the gain phase (P2). Finally, switch S2d is closed in response to the sampling phase clock signal (P1) or when the switch control signal l2=1 or m2=1 during the gain phase (P2).

Finally, the third reference loading circuit 124 connects the reference voltages Vrefp, Vrefm across switched capacitors C3c, C4c to the central node 124 (which is in turn connected to the amplifier common-mode voltage (Vcm) via switch S9) via switches S3a-d under control of the sampling phase clock signal (P1) and the switch control signals (h3 or l3 or m3) of the gain phase (P2). In particular, switch S3a is closed in response to the sampling phase clock signal (P1) or when the switch control signal h3=1 or m3=1 during the gain phase (P2). In addition, switch S3b is closed in response to the switch control signal l3=1 during the gain phase (P2), and switch S3c is closed in response to the switch control signal h3=1 during the gain phase (P2). Finally, switch S3d is closed in response to the sampling phase clock signal (P1) or when the switch control signal l3=1 or m3=1 during the gain phase (P2).

Figure 17:
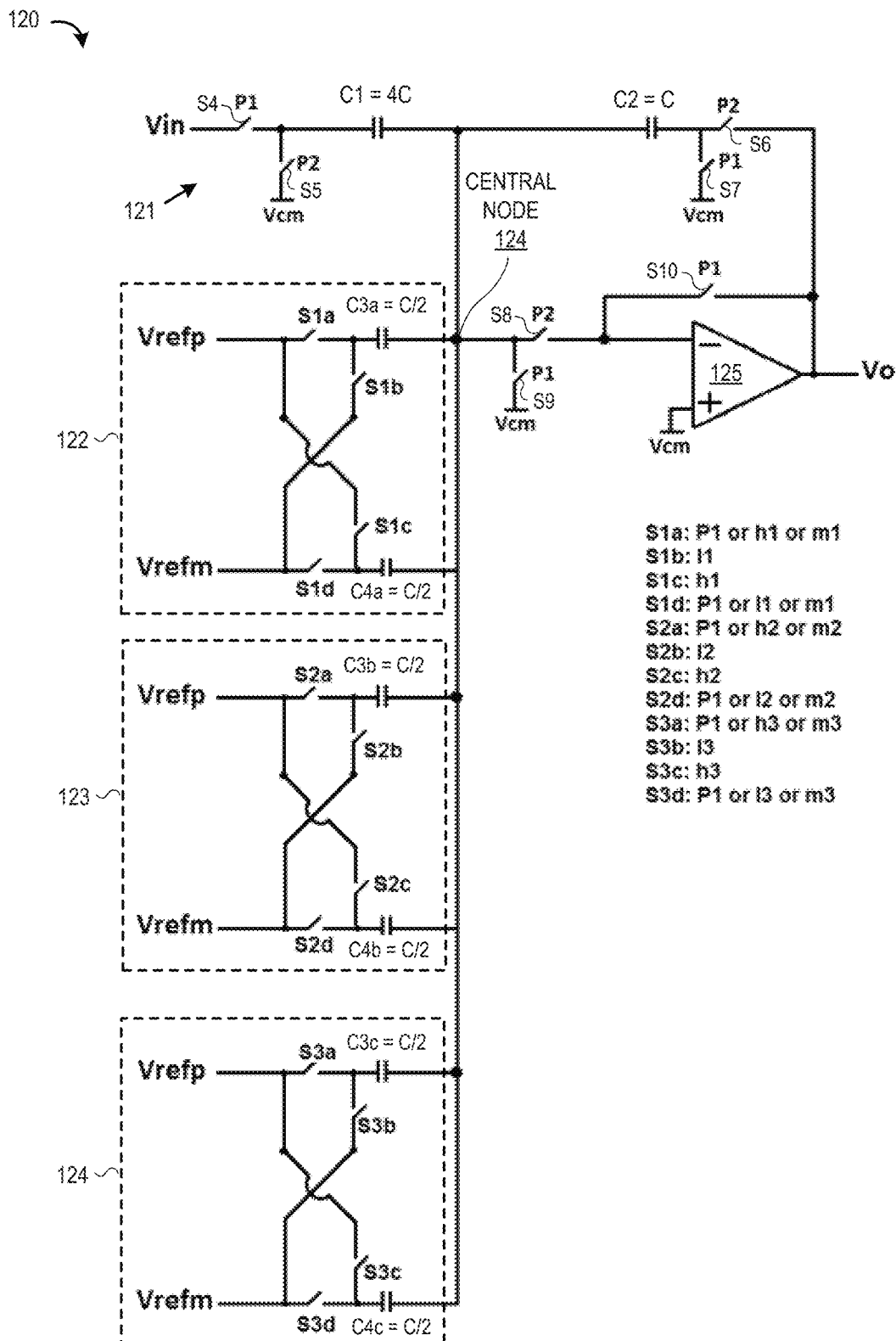
FIG. 17 is a simplified circuit diagram illustrating a mismatch and reference common-mode offset insensitive single-ended 2.5 bit RSD stage employing a non-flip-around MDAC architecture in accordance with selected embodiments of the present disclosure.
Figure 18:
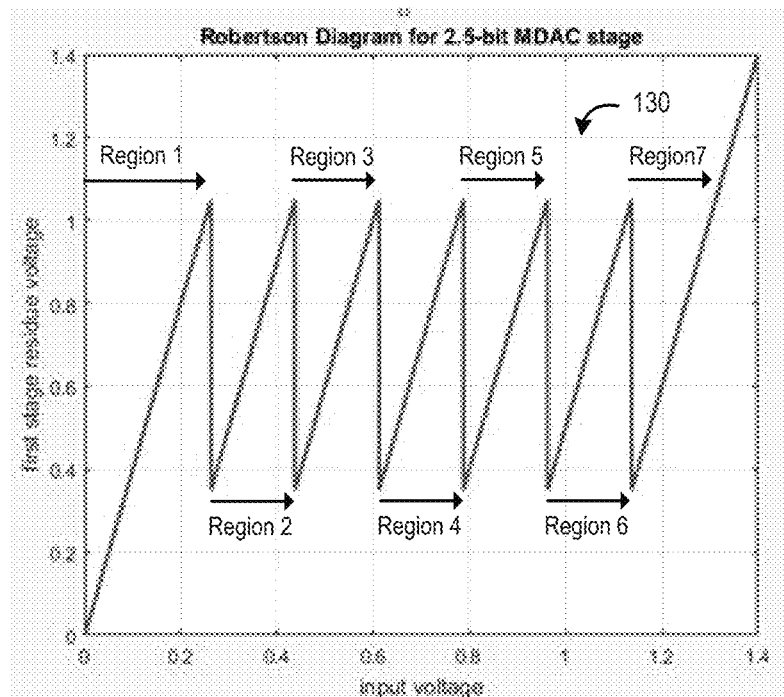
FIG. 18 diagrammatically depicts an output voltage waveform of the single-ended 2.5 bit RSD stage shown in FIG. 17.

Referring now to FIG. 18, there is diagrammatically depicted an output voltage waveform 131 of the single-ended 2.5 bit RSD stage shown in FIG. 17 wherein the output voltage Vout is defined for Regions 1-7. In particular, the output voltage in Region 1 (where the input signal is less than the region 1 boundary) is Vout=4Vin+(3/2)(Vrefp−Vrefm). In Region 2, the output voltage Vout=4Vin+(Vrefp−Vrefm). In Region 3, the output voltage Vout=4Vin+(½)(Vrefp−Vrefm). In Region 4, the output voltage Vout=4Vin. In Region 5, the output voltage Vout=4Vin−(½)(Vrefp−Vrefm). In Region 6, the output voltage Vout=4Vin−(Vrefp+Vrefm). And in Region 7, the output voltage Vout=4Vin−(3/2)(Vrefp−Vrefm).

Figure 19:
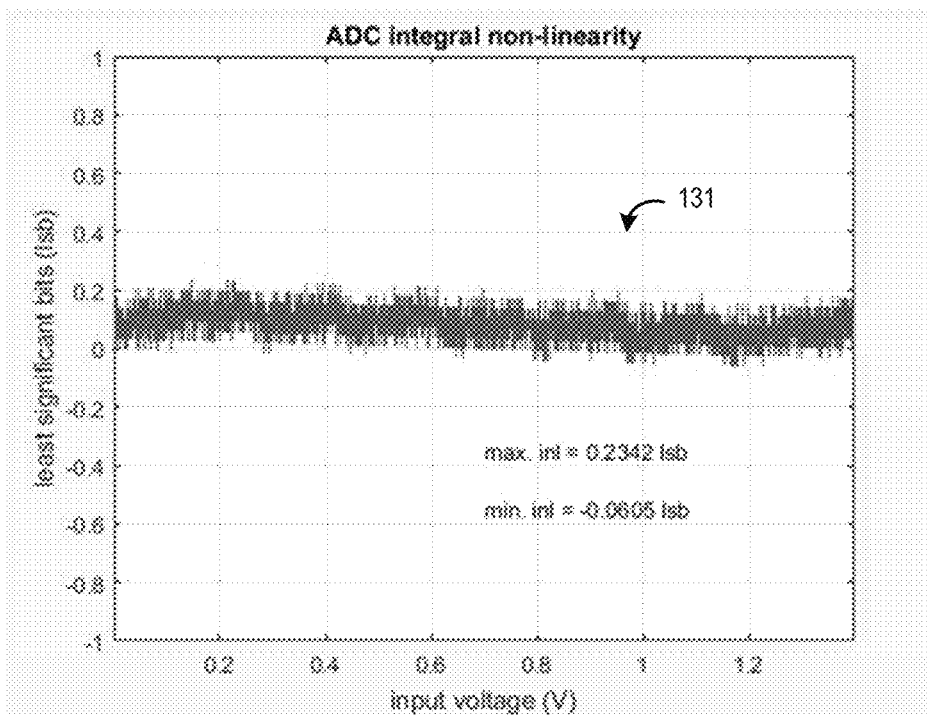
FIG. 19 is a simulated waveform depiction of an integral non-linearity signal of a single-ended RSD ADC implemented using a single-ended 2.5 bit RSD stage shown in FIG. 17 with a first set of reference voltages (Vrefp, Vrefm) and no offset.
Figure 20:
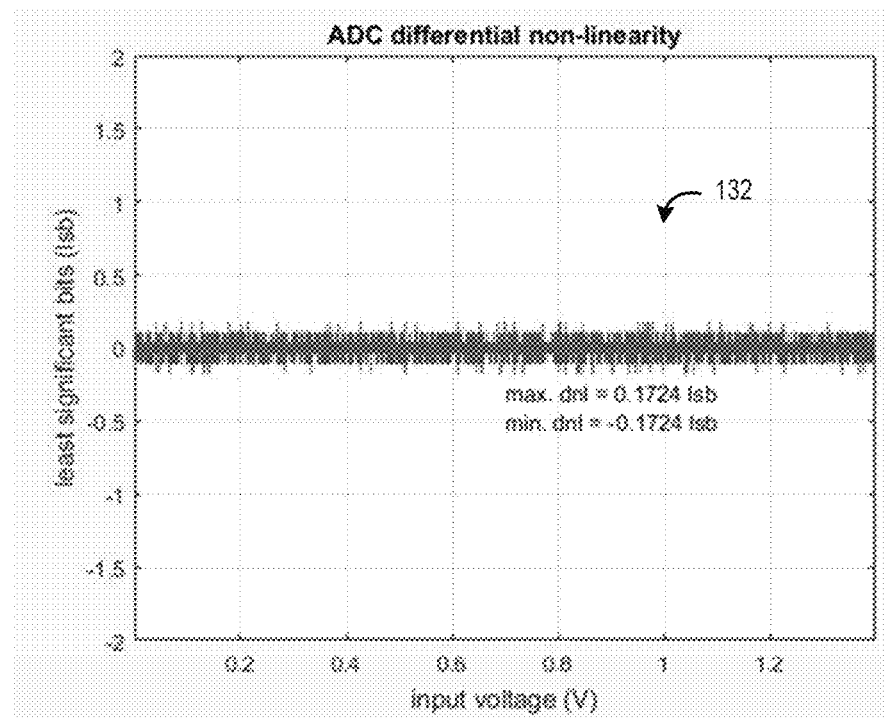
FIG. 20 is a simulated waveform depiction of a differential non-linearity signal of a single-ended RSD ADC implemented using a single-ended 2.5 bit RSD stage shown in FIG. 17 with a first set of reference voltages (Vrefp, Vrefm) and no offset.
Figure 21:
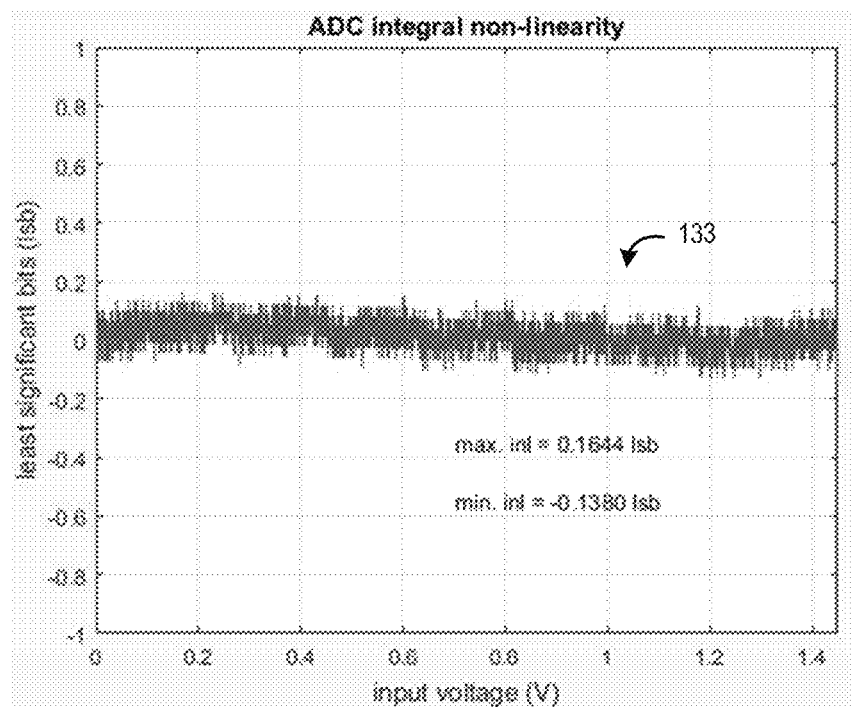
FIG. 21 is a simulated waveform depiction of an integral non-linearity signal of a single-ended RSD ADC implemented using a single-ended 2.5 bit RSD stage shown in FIG. 17 with a second set of reference voltages (Vrefp, Vrefm) and a first offset from a first reference voltage (Vrefp).
Figure 22:
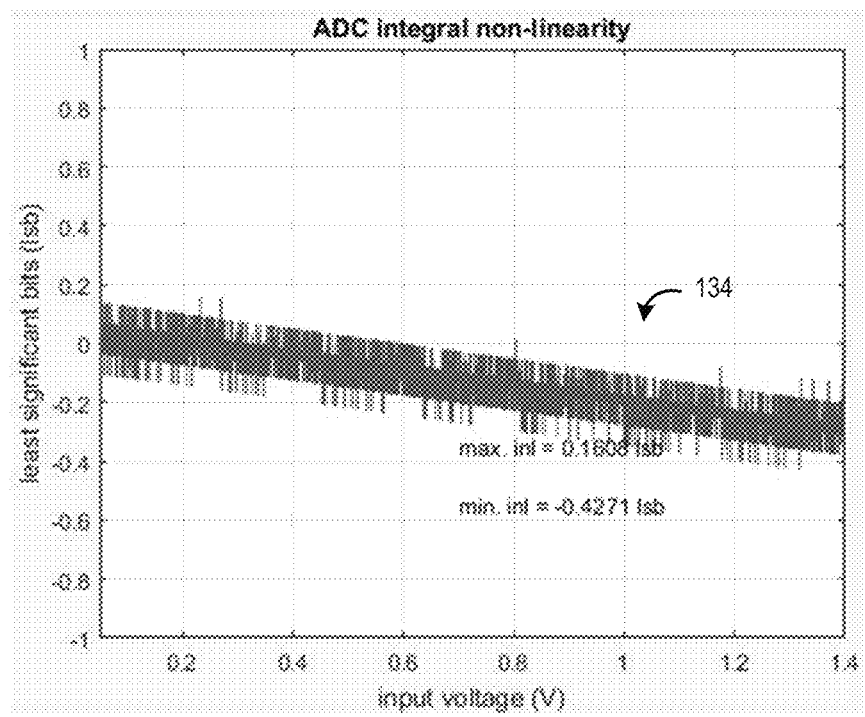
FIG. 22 is a simulated waveform depiction of an integral non-linearity signal of a single-ended RSD ADC implemented using a single-ended 2.5 bit RSD stage shown in FIG. 17 with a third set of reference voltages (Vrefp, Vrefm) and a first offset from a second reference voltage (Vrefm).

To illustrate the linearity impact from generating the Vcmr by selectively applying the first and second reference voltages (Vrefp, Vrefm) to the switched capacitors C3a-d, C4a-d in both the sampling and gain phases (P1, P2), reference is now made to FIG. 19 which depicts a MATLAB simulated waveform of an integral non-linearity signal 131 in a single-ended cyclic ADC composed of two 2.5 bit RSD stages 120 with a first set of reference voltages (Vrefp=1.4V, Vrefm=0V) and no offset. As shown with the simulated waveform 131, good linearity (<1) is obtained with the "no offset" scenario, achieving a minimum INL measure and maximum INL measure between +/−1 LSB. In addition, good differential linearity is obtained for the "no offset" scenario, as illustrated with FIG. 20 which depicts a MATLAB simulated waveform of a differential integral non-linearity signal 132 in a single-ended cyclic ADC composed of two 2.5 bit RSD stages 120 which achieve a minimum DNL measure and maximum DNL measure between +/−1 LSB. Likewise, good linearity (<1) is obtained when a small offset (e.g., 50 mV) from a first reference voltage (Vrefp) is introduced into the simulation, as illustrated with FIG. 21 which depicts a MATLAB simulated waveform of an integral non-linearity signal 133 in a single-ended cyclic ADC composed of two 2.5 bit RSD stages 120 with a second set of reference voltages (Vrefp=1.4V, Vrefm=0V) and a first 50 mV offset from a first reference voltage (Vrefp). As shown with the simulated waveform 133, a good linearity measure in the 50 mV offset scenario achieved, achieving a minimum INL measure and maximum INL measure between +/−1 LSB. In addition, it can be seen that good linearity (<1) is obtained when an offset (e.g., 50 mV) from a second reference voltage (Vrefm) is introduced into the simulation, as illustrated with FIG. 22 which depicts a MATLAB simulated waveform of an integral non-linearity signal 134 in a single-ended cyclic ADC composed of two 2.5 bit RSD stages 120 with a third set of reference voltages (Vrefp=1.4V, Vrefm=0V) and a first 50 mV offset from a second reference voltage (Vrefm), achieving a minimum INL measure and maximum INL measure between +/−1 LSB.

By now it should be appreciated that there has been provided a switched-capacitor gain stage circuit, apparatus, method, and system for generating the common-mode reference voltage. In the disclosed embodiments, the switched-capacitor gain stage circuit includes an input node connected to receive an input voltage; an operational amplifier having a first amplifier input, a second amplifier input, and an amplifier output for outputting an output voltage; an input sampling circuit; a reference loading circuit; and a switching configuration of switches. The operational amplifier is connected in a non-flip-around configuration wherein the output voltage is generated by connecting the output Vo over a feedback capacitor (C2) to a central node during a gain phase, and where the amplifier output is connected in feedback to the first amplifier input during a sampling phase. In selected embodiments, the operational amplifier includes a correlated double-sampling amplifier and/or a correlated level shifting-based amplifier. The input sampling circuit includes a first input sampling switched capacitor (C1) connected in a first switching configuration to selectively couple the input node to the central node (which is in turn connected to the amplifier common-mode voltage (Vcm)) during the sampling phase, and to selectively couple the central node to the first amplifier input during the gain phase. The reference loading circuit includes a plurality of sampling switched capacitors (C3, C4) connected in a second switching configuration to selectively couple a first reference voltage and/or a second reference voltage to the central node by pre-charging the plurality of sampling switched capacitors with the first and second reference voltages during the sampling phase, and by coupling each of the first and second reference voltages to at least one of the plurality of sampling switched capacitors when connected to the central node during the gain phase. In the reference loading circuit, the first reference voltage is connected across first and second sampling switched capacitors to the central node at the gain phase when the input voltage is above a high threshold voltage and is connected across the first input sampling switched capacitor to the central node at the gain phase when the input voltage is between the high threshold voltage and a low threshold voltage. In addition, the second reference voltage is connected across first and second sampling switched capacitors to the central node at the gain phase when the input voltage is below the high threshold voltage and is connected across the second sampling switched capacitor to the central node at the gain phase when the input voltage is between the high threshold voltage and a low threshold voltage. In selected embodiments, the feedback capacitor may have a first capacitance value C2, the first input sampling switched capacitor may have a second capacitance value C1 that is twice as large as the first capacitance value C2, and each of the plurality of sampling switched capacitors may have a third capacitance value C3 that is half as large as the first capacitance value C2. In other embodiments, the plurality of sampling switched capacitors in the reference loading circuit includes a first sampling switched capacitor (C3) and a second sampling switched capacitor (C4). The first sampling switched capacitor (C3) selectively couples the central node to the first reference voltage (Vrefp) during the sampling phase, and selectively couples the first amplifier input to either the first or second reference voltages during the gain phase. In addition, the second sampling switched capacitor (C4) selectively couples the central node to the second reference voltage (Vrefm) during the sampling phase, and selectively couples the first amplifier input to either the first or second reference voltages during the gain phase. In such embodiments, the first sampling switched capacitor (C3) selectively couples the first amplifier input to the first reference voltage during the gain phase when the input voltage is above the low threshold voltage, and selectively couples the first amplifier input to the second reference voltage during the gain phase when the input voltage is below the low threshold voltage. In addition, the second sampling switched capacitor (C4) selectively couples the first amplifier input to the second reference voltage during the gain phase when the input voltage is below the high threshold voltage, and selectively couples the first amplifier input to the first reference voltage during the gain phase when the input voltage is above the high threshold voltage. In other embodiments, the reference loading circuit includes a first reference loading equalization circuit selectively coupled between the first and second reference voltages to equalize loading on the plurality of sampling switched capacitors by the first and second reference voltages by pre-charging the first sampling switched capacitor (C3) to the first reference voltage and pre-charging the second sampling switched capacitor (C4) to the second reference voltage. In the switching configuration, multiple switches are controllable to connect the first input sampling switched capacitor and the plurality of sampling switched capacitors to the central node in the sampling phase, and to connect the amplifier output in feedback to the input sampling circuit in the gain phase while simultaneously connecting the central node to the first amplifier input.

In another form, there is provided an electronic system, circuit, apparatus, and method which include a switched-capacitor gain stage circuit, a plurality of capacitors, and a switching configuration. In the disclosed embodiments, the switched-capacitor gain stage circuit includes an input node (Vin), an output node (Vo), a central node, and an operational amplifier comprising a first amplifier input, a second amplifier input, and an amplifier output, where the operational amplifier is connected in a non-flip-around configuration wherein the amplifier output is connected over a feedback capacitor to a central node during a gain phase. The plurality of capacitors includes a first capacitor (C1) that selectively couples the central node to the input node during a sampling phase and that is selectively coupled over the central node to the first amplifier input during the gain phase. The plurality of capacitors also includes a second capacitor (C3) that selectively couples a first reference voltage (Vrefp) to the central node to pre-charge the second capacitor with the first reference voltage during the sampling phase, and that selectively couples the first reference voltage and/or a second reference voltage over the central node to the first amplifier input during the gain phase. In addition, the plurality of capacitors includes a third capacitor (C4) that selectively couples the second reference voltage (Vrefm) to the central node to pre-charge the third capacitor with the second reference voltage during the sampling phase, and that selectively couples the first reference voltage and/or second reference voltage over the central node to the first amplifier input during the gain phase. In the switching configuration, multiple switches (S1-S11) are controllable to connect the first capacitor between the input node and the central node during the sampling phase while simultaneously connecting a common mode voltage over the feedback capacitor to the central node while also connecting the amplifier output to the first amplifier input, and to connect the amplifier output in feedback over the feedback capacitor to the central node during the gain phase while simultaneously connecting the central node to the first amplifier input and disconnecting the input node from the first and second capacitors during the gain phase. In selected embodiments, the multiple switches include a first switch coupling the first capacitor (C1) to the input node (Vin) during the sampling phase; a second switch coupling the central node to a common mode reference voltage (Vcm) during the sampling phase; a third switch coupling the feedback capacitor to the common mode reference voltage (Vcm) during the sampling phase; a fourth switch coupling the second capacitor (C3) to the first reference voltage during the sampling phase; a fifth switch coupling the third capacitor (C4) to the second reference voltage during the sampling phase; and a sixth switch coupling the amplifier output to the first amplifier input during the sampling phase. In other embodiments, the multiple switches include a first switch which disconnects the first capacitor (C1) from the input node (Vin) during the gain phase; a second switch coupling the first capacitor to a common mode reference voltage (Vcm) during the gain phase; a third switch coupling the second capacitor (C3) to the first reference voltage during the gain phase when the input voltage is above a low threshold voltage; a fourth switch coupling the second capacitor (C3) to the second reference voltage during the gain phase when the input voltage is below the low threshold voltage; a fifth switch coupling the third capacitor (C4) to the second reference voltage during the gain phase when the input voltage is below a high threshold voltage; a sixth switch coupling the third capacitor (C4) to the first reference voltage during the gain phase when the input voltage is above the high threshold voltage; a seventh switch coupling the central node to the first amplifier input during the gain phase; and an eighth switch coupling the amplifier output to the feedback capacitor during the gain phase. In selected embodiments, the feedback capacitor has a first capacitance value C2, the first capacitor has a second capacitance value C that is twice as large as the first capacitance value C2, and each of the second and third capacitors each have a third capacitance value that is half as large as the first capacitance value C2.

In operation, the first reference voltage is connected across first capacitor to the central node at the gain phase when the input voltage is above a low threshold voltage and is connected across the second capacitor to the central node at the gain phase when the input voltage is above a high threshold voltage. In addition, the second reference voltage is connected across second capacitor to the central node at the gain phase when the input voltage is below a high threshold voltage and is connected across the first capacitor to the central node at the gain phase when the input voltage is below a low threshold voltage. In selected embodiments, the disclosed electronic system, circuit, apparatus, and method may also include a first reference loading equalization circuit that is selectively coupled between the first and second reference voltages to equalize loading on the first and second reference voltages by the first and second sampling capacitors by pre-charging the second capacitor (C3) to the first reference voltage and pre-charging the third capacitor (C4) to the second reference voltage. In such embodiments, the first reference loading equalization circuit includes first and second pre-charge capacitors selectively coupled between the first reference voltage and a common mode reference voltage (Vcm) (either in parallel or in series) during the sampling phase, where the first pre-charge capacitor is selectively coupled between the common mode reference voltage (Vcm) and the first reference voltage during the gain phase when the input voltage is below a high voltage threshold and where the second pre-charge capacitor is selectively coupled between the common mode reference voltage (Vcm) and the second reference voltage during the gain phase when the input voltage is above the high voltage threshold. In addition, the first reference loading equalization circuit may include third and fourth pre-charge capacitors selectively coupled between the second reference voltage and the common mode reference voltage (Vcm) (either in parallel or in series) during the sampling phase, where the third pre-charge capacitor is selectively coupled between the common mode reference voltage (Vcm) and the second reference voltage during the gain phase when the input voltage is above the low voltage threshold and where the second pre-charge capacitor is selectively coupled between the common mode reference voltage (Vcm) and the first reference voltage during the gain phase when the input voltage is below the low voltage threshold.

In yet another form, there is provided a switched-capacitor gain stage circuit, apparatus, method, and system for applying a gain to an input signal with a switched-capacitor gain stage circuit including an input node, an output node, a plurality of sampling capacitors, and an operational amplifier connected in a non-flip-around configuration including a first amplifier input, a second amplifier input, and an amplifier output. In the disclosed embodiments, multiple switches of the switched-capacitor gain stage circuit are configured in a first configuration where an input sampling switched capacitor selectively couples the input node to a central node during a sampling phase which is in turn coupled to a common mode reference voltage, and where both terminals of a feedback sampling switched capacitor are selectively coupled to a common mode reference voltage (Vcm) via the central node during the sampling phase, and where a reference loading circuit selectively couples first and second first references to pre-charge first and second sampling switched capacitors during the sampling phase. In selected embodiments, the configuration of the multiple switches in the first configuration includes storing a first charge component representing the input signal from the input node on the input sampling switched capacitor (C1) having an output terminal connected to a central node which is in turn coupled to a common-mode reference voltage; discharging a feedback sampling feedback capacitor (C2) by selectively connecting both terminals to a common mode reference voltage (Vcm); storing a third charge component representing the first reference voltage (Vrefp) on the first sampling switched capacitor (C3) having an output terminal connected to the central node; and storing a fourth charge component representing the second reference voltage (Vrefm) on the second sampling switched capacitor (C4) having an output terminal connected to the central node which is in turn coupled to a common-mode reference voltage. In addition, the multiple switches are configured in a second configuration where the input sampling switched capacitor selectively couples a common mode reference voltage (Vcm) to the first amplifier input during the gain phase, where the feedback sampling switched capacitor selectively couples the amplifier output to the central node during the gain phase, and where the reference loading circuit selectively couples each of the first and second reference voltages over at least one of the first and second sampling switched capacitors to the first amplifier input during the gain phase. In selected embodiments, the configuration of the multiple switches in the second configuration includes connecting the output terminals of the input sampling switched capacitor, feedback sampling switched capacitor, and first and second sampling switched capacitors to the first amplifier input during a gain phase while transferring fifth and sixth charge components representing the first reference voltage (Vrefp) that was stored on the first sampling switched capacitor (C3) and representing the second reference voltage (Vrefm) that was stored on the second sampling switched capacitor (C4) during the sampling phase to the sampling feedback capacitor (C2) during the gain phase thereby generating an appropriate residue voltage when the input voltage is above the low voltage threshold, or selectively connecting the first reference voltage (Vrefp) to both the first sampling switched capacitor (C3) and the second switched capacitor (C4) during the gain phase to transfer the fifth and sixth charge components to the sampling feedback capacitor (C2) to generate a second appropriate residue voltage when the input voltage is above the high voltage threshold; or again selectively connecting the second reference voltage (Vrefm) to both the first sampling switched capacitor (C3) and the second switched capacitor (C4) during the gain phase to transfer the fifth and sixth charge components to the sampling feedback capacitor (C2) to generate a third appropriate residue voltage when the input voltage is below the low voltage threshold. In the disclosed methodology, a reference loading equalization circuit may be selectively coupled between the first and second reference voltages to equalize loading on the first and second sampling switched capacitors by the first and second reference voltages by pre-charging the first sampling switched capacitor (C3) to the first reference voltage and pre-charging the second sampling switched capacitor (C4) to the second reference voltage.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Because selected embodiments implementing the present invention are, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of ADC 10 are circuitry located on a single integrated circuit or within a same device. Alternatively, ADC 10 may include any number of separate integrated circuits or separate devices interconnected with each other.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the comparators of the various ADC stages can be 1.5 bit (as illustrated), 2.5 bit, 3.5 bit, and the like, allowing triggering off of different input voltage amplitudes. The switched-capacitor sampling stages of the ADC stages would likewise be altered to use the control signals thus generated by the comparators. As discussed above, embodiments are also not limited to dual channel ADC stages, and can utilize any number of channels as dictated by space and power consumption concerns. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

Although the described exemplary embodiments disclosed herein are directed to methods and systems for dynamically generating a reference common mode voltage in a switched capacitor gain stage circuit, system, architecture, and methodology, the present invention is not necessarily limited to the example embodiments illustrate herein, and various embodiments of the circuitry and methods disclosed herein may be implemented with other devices and circuit components. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Various illustrative embodiments of the present invention have been described in detail with reference to the accompanying figures. While various details are set forth in the foregoing description, it will be appreciated that the present invention may be practiced without these specific details, and that numerous implementation-specific decisions may be made to the invention described herein to achieve the circuit designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in block diagram form, rather than in detail, in order to avoid limiting or obscuring the present invention. In addition, some portions of the detailed descriptions provided herein are presented in terms of algorithms or operations on data within a computer memory. Such descriptions and representations are used by those skilled in the art to describe and convey the substance of their work to others skilled in the art.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A switched-capacitor gain stage circuit comprising:
an input node connected to receive an input voltage;
an operational amplifier including a first amplifier input, a second amplifier input, and an amplifier output for outputting an output voltage, where the operational amplifier is connected in a non-flip-around configuration wherein the output voltage is connected over a feedback capacitor to a central node during a gain phase;
an input sampling circuit comprising a first input sampling switched capacitor connected in a first switching configuration to selectively couple the input node over the central node to a common-mode reference voltage during the sampling phase, and to selectively couple the central node to the first amplifier input during the gain phase; and
a reference loading circuit comprising a plurality of sampling switched capacitors connected in a second switching configuration to selectively couple a first reference voltage and/or a second reference voltage to the central node by pre-charging the plurality of sampling switched capacitors with the first and second reference voltages during the sampling phase, and by coupling each of the first and second reference voltages to at least one of the plurality of sampling switched capacitors when connected to the central node during the gain phase;
where the switching configuration comprises multiple switches that are controllable to connect the first input sampling switched capacitor and the plurality of sampling switched capacitors to the central node in the sampling phase, and to connect the amplifier output in feedback to the input sampling circuit in the gain phase while simultaneously connecting the central node to the first amplifier input.

2. The switched-capacitor gain stage circuit of claim 1, where the feedback capacitor has a first capacitance value $C2$, where the first input sampling switched capacitor has a second capacitance value $C1$ that is twice as large as the first capacitance value $C2$, and where each of the plurality of sampling switched capacitors have a third capacitance value $C3$ that is half as large as the first capacitance value $C2$.

3. The switched-capacitor gain stage circuit of claim 1, where the amplifier output is connected in feedback to the first amplifier input during a sampling phase and is connected over the feedback capacitor to the central node during the gain phase.

4. The switched-capacitor gain stage circuit of claim 1, wherein the first reference voltage is connected across first and second sampling switched capacitors to the central node at the gain phase when the input voltage is above a high threshold voltage and is connected across the first sampling switched capacitor to the central node at the gain phase when the input voltage is between the high threshold voltage and a low threshold voltage.

5. The switched-capacitor gain stage circuit of claim 4, wherein the second reference voltage is connected across first and second sampling switched capacitors to the central node at the gain phase when the input voltage is below the high threshold voltage and is connected across the second sampling switched capacitor to the central node at the gain phase when the input voltage is between the high threshold voltage and a low threshold voltage.

6. The switched-capacitor gain stage circuit of claim 1, where the reference loading circuit comprises:
a first sampling switched capacitor that selectively couples the central node to the first reference voltage (Vrefp) during the sampling phase, and that selectively couples the first amplifier input to either the first or second reference voltages during the gain phase; and
a second sampling switched capacitor that selectively couples the central node to the second reference voltage (Vrefm) during the sampling phase, and that selectively couples the first amplifier input to either the first or second reference voltages during the gain phase;

wherein the first sampling switched capacitor selectively couples the first amplifier input to the first reference voltage during the gain phase when the input voltage is above the low threshold voltage, and selectively couples the first amplifier input to the second reference voltage during the gain phase when the input voltage is below the low threshold voltage; and wherein the second sampling switched capacitor selectively couples the first amplifier input to the second reference voltage during the gain phase when the input voltage is below the high threshold voltage, and selectively couples the first amplifier input to the first reference voltage during the gain phase when the input voltage is above the high threshold voltage.

7. The switched-capacitor gain stage circuit of claim 6, where the reference loading circuit comprises a first reference loading equalization circuit selectively coupled between the first and second reference voltages to equalize loading on the first and second reference voltages by the plurality of sampling switched capacitors by pre-charging the first sampling switched capacitor to the first reference voltage and pre-charging the second sampling switched capacitor to the second reference voltage.

8. The switched-capacitor gain stage circuit of claim 1, where the operational amplifier comprises a correlated double-sampling amplifier and/or a correlated level shifting-based amplifier.

9. An electronic system comprising:
a switched-capacitor gain stage circuit comprising an input node (Vin), an output node (Vo), a central node, and an operational amplifier comprising a first amplifier input, a second amplifier input, and an amplifier output, where the operational amplifier is connected in a non-flip-around configuration wherein the amplifier output is connected over a feedback capacitor to a central node during a gain phase;
a first capacitor (C1) that selectively couples the central node to the input node during a sampling phase and that is selectively coupled over the central node to the first amplifier input during the gain phase;
one or more reference loading circuits connecting a first reference voltage (Vrefp) and a second reference voltage (Vrefm) to the common node, each reference loading circuit comprising:
a second capacitor (C3) that selectively couples the first reference voltage (Vrefp) to the central node to pre-charge the second capacitor with the first reference voltage during the sampling phase, and that selectively couples the first reference voltage and/or the second reference voltage over the central node to the first amplifier input during the gain phase;
a third capacitor (C4) that selectively couples the second reference voltage (Vrefm) to the central node to pre-charge the third capacitor with the second reference voltage during the sampling phase, and that selectively couples the first reference voltage and/or second reference voltage over the central node to the first amplifier input during the gain phase; and
a switching configuration including multiple switches that are controllable to connect the first capacitor between the input node and the central node during the sampling phase while simultaneously connecting a common-mode voltage over the feedback capacitor to the central node while also connecting the amplifier output to the first amplifier input, and to connect the amplifier output in feedback over the feedback capacitor to the central node during the gain phase while simultaneously connecting the central node to the first amplifier input and disconnecting the input node from the first and second capacitors during the gain phase.

10. The electronic system of claim 9, wherein the multiple switches comprise:
a first switch coupling the first capacitor (C1) to the input node (Vin) during the sampling phase;
a second switch coupling the central node to the common-mode reference voltage (Vcm) during the sampling phase;
a third switch coupling the feedback capacitor to the common-mode reference voltage (Vcm) during the sampling phase;
a fourth switch coupling the second capacitor (C3) to the first reference voltage during the sampling phase;
a fifth switch coupling the third capacitor (C4) to the second reference voltage during the sampling phase; and
a sixth switch coupling the amplifier output to the first amplifier input during the sampling phase.

11. The electronic system of claim 9, wherein the multiple switches comprise:
a first switch which disconnects the first capacitor (C1) from the input node (Vin) during the gain phase;
a second switch coupling the first capacitor to the common-mode reference voltage (Vcm) during the gain phase;
a third switch coupling the second capacitor (C3) to the first reference voltage during the gain phase when the input voltage is above a low threshold voltage;
a fourth switch coupling the second capacitor (C3) to the second reference voltage during the gain phase when the input voltage is below the low threshold voltage;
a fifth switch coupling the third capacitor (C4) to the second reference voltage during the gain phase when the input voltage is below a high threshold voltage;
a sixth switch coupling the third capacitor (C4) to the first reference voltage during the gain phase when the input voltage is above the high threshold voltage;
a seventh switch coupling the central node to the first amplifier input during the gain phase; and
an eighth switch coupling the amplifier output to the feedback capacitor during the gain phase.

12. The electronic system of claim 9, wherein the feedback capacitor has a first capacitance value C2, where the first capacitor has a second capacitance value C1 that is twice as large as the first capacitance value C2, and where each of the second and third capacitors each have a third capacitance value that is half as large as the first capacitance value C2.

13. The electronic system of claim 9, wherein the first reference voltage is connected across first capacitor to the central node at the gain phase when the input voltage is above a low threshold voltage and is connected across the second capacitor to the central node at the gain phase when the input voltage is above a high threshold voltage.

14. The electronic system of claim 13, wherein the second reference voltage is connected across second capacitor to the central node at the gain phase when the input voltage is below a high threshold voltage and is connected across the first capacitor to the central node at the gain phase when the input voltage is below a low threshold voltage.

15. The electronic system of claim 9, further comprising a first reference loading equalization circuit selectively coupled between the first and second reference voltages to equalize loading by the second and third capacitors on the first and second reference voltages by pre-charging the second capacitor (C3) to the first reference voltage and pre-charging the third capacitor (C4) to the second reference voltage.

16. The electronic system of claim 15, where first reference loading equalization circuit comprises:
first and second pre-charge capacitors selectively coupled between the first reference voltage and the common-mode reference voltage (Vcm) during the sampling phase, where the first pre-charge capacitor is selectively coupled between the common mode reference voltage (Vcm) and the first reference voltage during the gain phase when the input voltage is below a high voltage threshold and where the second pre-charge capacitor is selectively coupled between the common mode reference voltage (Vcm) and the second reference voltage during the gain phase when the input voltage is above the high voltage threshold; and
third and fourth pre-charge capacitors selectively coupled between the second reference voltage and the common mode reference voltage (Vcm) during the sampling phase, where the third pre-charge capacitor is selectively coupled between the common mode reference voltage (Vcm) and the second reference voltage during the gain phase when the input voltage is above the low voltage threshold and where the fourth pre-charge capacitor is selectively coupled between the common mode reference voltage (Vcm) and the first reference voltage during the gain phase when the input voltage is below the low voltage threshold.

17. The electronic system of claim 15, where first reference loading equalization circuit comprises:
first and second pre-charge capacitors selectively coupled in series between the first reference voltage and the common-mode reference voltage (Vcm) during the sampling phase, where the first pre-charge capacitor is selectively coupled between the common mode reference voltage (Vcm) and the first reference voltage during the gain phase when the input voltage is below a high voltage threshold and where the second pre-charge capacitor is selectively coupled between the common mode reference voltage (Vcm) and the second reference voltage during the gain phase when the input voltage is above the high voltage threshold; and
third and fourth pre-charge capacitors selectively coupled in series between the second reference voltage and the common mode reference voltage (Vcm) during the sampling phase, where the third pre-charge capacitor is selectively coupled between the common mode reference voltage (Vcm) and the second reference voltage during the gain phase when the input voltage is above the low voltage threshold and where the fourth pre-charge capacitor is selectively coupled between the common mode reference voltage (Vcm) and the first reference voltage during the gain phase when the input voltage is below the low voltage threshold.

18. A method for applying a gain to an input signal, the method performed in a switched-capacitor gain stage circuit including an input node, an output node, a plurality of sampling capacitors, and an operational amplifier connected in a non-flip-around configuration including a first amplifier input, a second amplifier input, and an amplifier output, the method comprising the steps of:
first configuring multiple switches of the switched-capacitor gain stage circuit in a first configuration where an input sampling switched capacitor selectively couples the input node to a central node which is in turn coupled to a common-mode reference voltage (Vcm) during a sampling phase, where both terminals of a feedback sampling switched capacitor are selectively coupled to the common mode reference voltage via the central node during the sampling phase, and where a reference loading circuit selectively couples first and second first references to pre-charge first and second sampling switched capacitors during the sampling phase; and
second configuring multiple switches of the switched-capacitor gain stage circuit in a second configuration where the input sampling switched capacitor selectively couples the common mode reference voltage to the first amplifier input during the gain phase, where the feedback sampling switched capacitor selectively couples the amplifier output to the central node during the gain phase, and where the reference loading circuit selectively couples each of the first and second reference voltages over at least one of the first and second sampling switched capacitors to the first amplifier input during the gain phase.

19. The method of claim 18, wherein configuring the multiple switches of the switched-capacitor gain stage circuit in the first configuration comprises:
storing a first charge component representing the input signal from the input node on the input sampling switched capacitor (C1) having an output terminal connected to a central node which is in turn coupled to the common-mode reference voltage (Vcm);
discharging a feedback sampling feedback capacitor (C2) having an output node connected to the central node by selectively connecting both terminals of the feedback capacitor to the common-mode reference voltage (Vcm);
storing a third charge component representing the first reference voltage (Vrefp) on the first sampling switched capacitor (C3) having an output terminal connected to the central node; and
storing a fourth charge component representing the second reference voltage (Vrefm) on the second sampling switched capacitor (C4) having an output terminal connected to the central node which is in turn coupled to the common-mode reference voltage.

20. The method of claim 18, wherein configuring the multiple switches of the switched-capacitor gain stage circuit in the second configuration comprises connecting the output terminals of the input sampling switched capacitor, feedback sampling switched capacitor, and first and second sampling switched capacitors to the first amplifier input during a gain phase while:
transferring, during the gain phase, a fifth charge component representing the first reference voltage (Vrefp) that was stored on the first sampling switched capacitor (C3) during the sampling phase by connecting the first sampling capacitor (C3) to the first reference voltage (Vrefp) when the input voltage is above the low voltage threshold or to the second sampling switched capacitor (C4) during the gain phase when the input voltage is above the high voltage threshold, and
transferring, during the gain phase, a sixth charge component representing the second reference voltage (Vrefm) that was stored on the second sampling switched capacitor (C4) during the sampling phase by connecting the second sampling capacitor (C4) to the second reference voltage (Vrefm) when the input voltage is below the high voltage threshold or to the first sampling switched capacitor (C3) during the gain phase when the input voltage is below the low voltage threshold.

21. The method of claim 18, wherein the feedback sampling switched capacitor has a first capacitance value C2, where the input sampling switched capacitor has a second capacitance value C1 that is twice as large as the first capacitance value C2, and where each of the first and second sampling switched capacitors has a third capacitance value C3 that is half as large as the first capacitance value C2.

22. The method of claim 18, further comprising selectively coupling a reference loading equalization circuit between the first and second reference voltages to equalize loading on the first and second sampling switched capacitors by the first and second reference voltages by pre-charging the first sampling switched capacitor (C3) to the first reference voltage and pre-charging the second sampling switched capacitor (C4) to the second reference voltage.

* * * * *